(12) United States Patent
Ko et al.

(10) Patent No.: US 11,923,340 B2
(45) Date of Patent: Mar. 5, 2024

(54) SEMICONDUCTOR PACKAGE INCLUDING MOLD LAYER AND MANUFACTURING METHOD THEREOF

(71) Applicant: SAMSUNG ELECTRONICS CO., LTD., Suwon-si (KR)

(72) Inventors: Yeongkwon Ko, Hwaseong-si (KR); Jinwoo Park, Seoul (KR); Jaekyung Yoo, Seoul (KR); Teakhoon Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 142 days.

(21) Appl. No.: 17/405,130

(22) Filed: Aug. 18, 2021

(65) Prior Publication Data
US 2022/0293563 A1 Sep. 15, 2022

(30) Foreign Application Priority Data
Mar. 15, 2021 (KR) ........................ 10-2021-0033326

(51) Int. Cl.
*H01L 23/31* (2006.01)
*H01L 21/56* (2006.01)
(Continued)

(52) U.S. Cl.
CPC ........ *H01L 25/0657* (2013.01); *H01L 21/561* (2013.01); *H01L 23/295* (2013.01);
(Continued)

(58) Field of Classification Search
CPC ............. H01L 25/0652; H01L 25/0657; H01L 23/3135; H01L 23/3192; H01L 23/29;
(Continued)

(56) References Cited

U.S. PATENT DOCUMENTS 7,064,426 B2   6/2006   Karnezos
7,759,212 B2   7/2010   Lin et al.
(Continued)

FOREIGN PATENT DOCUMENTS

| JP | H10199936 A | * | 7/1998 | ............. H01L 24/32 |
| KR | 20010054743 A | | 7/2001 | |
| KR | 100866139 B1 | | 10/2008 | |

OTHER PUBLICATIONS

Takasugi, JP-H10199936-A, 1998, translation (Year: 1998).*

*Primary Examiner* — Phat X Cao
*Assistant Examiner* — William H Anderson
(74) *Attorney, Agent, or Firm* — Fish & Richardson P.C.

(57) ABSTRACT

A semiconductor package includes a package substrate on which a base chip is disposed. A first semiconductor chip is disposed on the base chip. A second semiconductor chip is disposed on the first semiconductor chip. An inner mold layer surrounds an upper surface of the base chip and respective side surfaces of the first semiconductor chip and the second semiconductor chip. A first outer mold layer is interposed between the package substrate and the base chip while covering at least a portion of a side surface of the base chip. A second outer mold layer is disposed on the first outer mold layer while covering at least a portion of a side surface of the inner mold layer. The second outer mold layer is spaced apart from the package substrate. The first outer mold layer and the second outer mold layer have different viscosities.

20 Claims, 23 Drawing Sheets

(51) Int. Cl.
  *H01L 23/00*   (2006.01)
  *H01L 23/29*   (2006.01)
  *H01L 25/00*   (2006.01)
  *H01L 25/065*  (2023.01)
  *H01L 25/18*   (2023.01)
(52) U.S. Cl.
  CPC .......... *H01L 23/3135* (2013.01); *H01L 24/94* (2013.01); *H01L 24/97* (2013.01); *H01L 25/0652* (2013.01); *H01L 25/50* (2013.01); *H01L 24/05* (2013.01); *H01L 24/06* (2013.01); *H01L 24/17* (2013.01); *H01L 24/33* (2013.01); *H01L 24/73* (2013.01); *H01L 24/92* (2013.01); *H01L 25/18* (2013.01); *H01L 2224/0557* (2013.01); *H01L 2224/06181* (2013.01); *H01L 2224/17181* (2013.01); *H01L 2224/33181* (2013.01); *H01L 2224/73204* (2013.01); *H01L 2224/73253* (2013.01); *H01L 2224/92143* (2013.01); *H01L 2225/06513* (2013.01); *H01L 2225/06517* (2013.01); *H01L 2225/06541* (2013.01); *H01L 2225/06586* (2013.01)
(58) Field of Classification Search
  CPC ... H01L 23/293; H01L 23/295; H01L 23/373; H01L 23/3737; H01L 23/42
  See application file for complete search history.

(56) References Cited

U.S. PATENT DOCUMENTS

| | | | |
|---|---|---|---|
| 8,604,615 | B2 | 12/2013 | Lee et al. |
| 10,790,164 | B1 | 9/2020 | Lin et al. |
| 2004/0061212 | A1 | 4/2004 | Karnezos |
| 2009/0001605 | A1 | 1/2009 | Kim et al. |
| 2009/0170242 | A1 | 7/2009 | Lin et al. |
| 2012/0126402 | A1* | 5/2012 | Hatakeyama ......... H01L 21/561 257/737 |
| 2012/0193779 | A1 | 8/2012 | Lee et al. |
| 2015/0318228 | A1* | 11/2015 | Ito ....................... H01L 25/0655 438/126 |
| 2017/0005072 | A1* | 1/2017 | Wei ......................... H01L 25/18 |
| 2018/0130760 | A1* | 5/2018 | Wang .................... H01L 21/568 |
| 2019/0080975 | A1* | 3/2019 | Lee ...................... H01L 23/3135 |
| 2019/0273068 | A1 | 9/2019 | Chen et al. |
| 2020/0006171 | A1 | 1/2020 | Yu et al. |
| 2020/0219845 | A1 | 7/2020 | Liu et al. |
| 2020/0365571 | A1 | 11/2020 | Chen et al. |
| 2021/0104483 | A1* | 4/2021 | Park ........................ H01L 24/16 |
| 2022/0068839 | A1* | 3/2022 | Ke ........................... H01L 24/96 |

* cited by examiner

SEMICONDUCTOR PACKAGE INCLUDING MOLD LAYER AND MANUFACTURING METHOD THEREOF

CROSS-REFERENCE TO THE RELATED APPLICATION

This U.S. nonprovisional patent application claims priority under 35 U.S.C. § 119 to Korean Patent Application No. 10-2021-0033326, filed on Mar. 15, 2021 in the Korean Intellectual Property Office, the disclosure of which is incorporated herein by reference in its entirety.

BACKGROUND

1. Field

The exemplary embodiments of the disclosure relate to a semiconductor package including a mold layer, and a manufacturing method thereof.

2. Description of the Related Art

In a semiconductor package including a plurality of vertically stacked semiconductor chips, there is a design limitation of droplets in an underfill process due to a reduction in spacing among the semiconductor chips. Furthermore, cracks may be generated at an underfill due to a warpage phenomenon and a thermal stress concentration phenomenon in the semiconductor package.

SUMMARY

The exemplary embodiments of the disclosure provide a semiconductor package having superior reliability.

A semiconductor package according to an exemplary embodiment of the disclosure includes a package substrate, a base chip disposed on the package substrate, a first semiconductor chip disposed on the base chip, a second semiconductor chip disposed on the first semiconductor chip, an inner mold layer surrounding an upper surface of the base chip and respective side surfaces of the first semiconductor chip and the second semiconductor chip, a first outer mold layer interposed between the package substrate and the base chip while covering at least a portion of a side surface of the base chip, and a second outer mold layer disposed on the first outer mold layer while covering at least a portion of a side surface of the inner mold layer, the second outer mold layer being spaced apart from the package substrate. The first outer mold layer and the second outer mold layer have different viscosities, respectively.

A semiconductor package according to an exemplary embodiment of the disclosure includes a package substrate, a sub-semiconductor package disposed on the package substrate, the sub-semiconductor package including a base chip disposed on the package substrate, a first semiconductor chip disposed on the base chip, a second semiconductor chip disposed on the first semiconductor chip, an inner mold layer covering an upper surface of the base chip while covering respective side surfaces of the first semiconductor chip and the second semiconductor chip, a main semiconductor chip disposed on the package substrate while being spaced apart from the sub-semiconductor package, and an outer mold layer covering the sub-semiconductor package and the main semiconductor chip. The outer mold layer includes a first outer mold layer interposed between the package substrate and the base chip and between the package substrate and the main semiconductor chip, and a second outer mold layer covering an upper surface of the first outer mold layer while being spaced apart from the package substrate. The first outer mold layer and the second outer mold layer have different viscosities, respectively.

A semiconductor package according to an exemplary embodiment of the disclosure includes a first package substrate, a second package substrate disposed on the first package substrate, a connecting bump and an underfill disposed between the first package substrate and the second package substrate, a base chip disposed on the second package substrate, the base chip including a base substrate, a through-silicon via (TSV) extending through the base substrate, and a connecting bump electrically connected to the TSV, the connecting bump being electrically connected to the second package substrate, a first semiconductor chip disposed on the base chip, the first semiconductor chip including a first semiconductor substrate, a first TSV extending through the first semiconductor substrate, and a first connecting bump electrically connected to the first TSV, the first connecting bump being electrically connected to the base chip, a plurality of second semiconductor chips disposed on the first semiconductor chip, an inner mold layer surrounding respective side surfaces of the base chip, the first semiconductor chip and the plurality of second semiconductor chips, a main semiconductor chip disposed on the second package substrate while being spaced apart from the base chip, the first semiconductor chip and the plurality of second semiconductor chips, a first outer mold layer interposed between the second package substrate and the base chip and between the second package substrate and the main semiconductor chip while surrounding the side surface of the base chip, the first outer mold layer including a first base material and a first filler, and a second outer mold layer covering the first outer mold layer and the inner mold layer while being spaced apart from the base chip, the second outer mold layer including a second base material and a second filler. A viscosity of the first base material is lower than a viscosity of the second base material. A size of the first filler is smaller than a size of the second filler.

A method for manufacturing a semiconductor package in accordance with an exemplary embodiment of the disclosure includes disposing sub-semiconductor packages and main semiconductor chips on a package substrate, thereby forming a semiconductor structure, disposing the semiconductor structure in a first mold, disposing, in a second mold, a mold film including a first mold film and a second mold film, coupling the first mold and the second mold to each other, thereby forming a cavity between the first mold and the second mold, and disposing the sub-semiconductor packages and the main semiconductor chips in the cavity, and heat treating the mold film, thereby forming a mold layer to cover the semiconductor structure and to fill the cavity, the mold layer including a first mold layer contacting the package substrate, and a second mold layer spaced apart from the package substrate.

A method for manufacturing a semiconductor package in accordance with an exemplary embodiment of the disclosure includes disposing sub-semiconductor packages on a package substrate, thereby forming a semiconductor structure, and forming a space between the package substrate and each of the semiconductor packages, disposing the semiconductor structure in a first mold, disposing, in a second mold, a mold film including a first mold film and a second mold film, coupling the first mold and the second mold to each other, thereby forming a cavity between the first mold and the second mold, and disposing the semiconductor structure in the cavity, and pressing the semiconductor structure against the mold film at about 1 to 20 MPa, and heating the mold film to 100 to 200° C., thereby forming a mold layer to cover the semiconductor structure and to fill the cavity, the mold layer including a first mold layer contacting the package substrate while filling the space, and a second mold layer spaced apart from the package substrate.

DETAILED DESCRIPTION OF EXEMPLARY EMBODIMENTS

Figure 1:
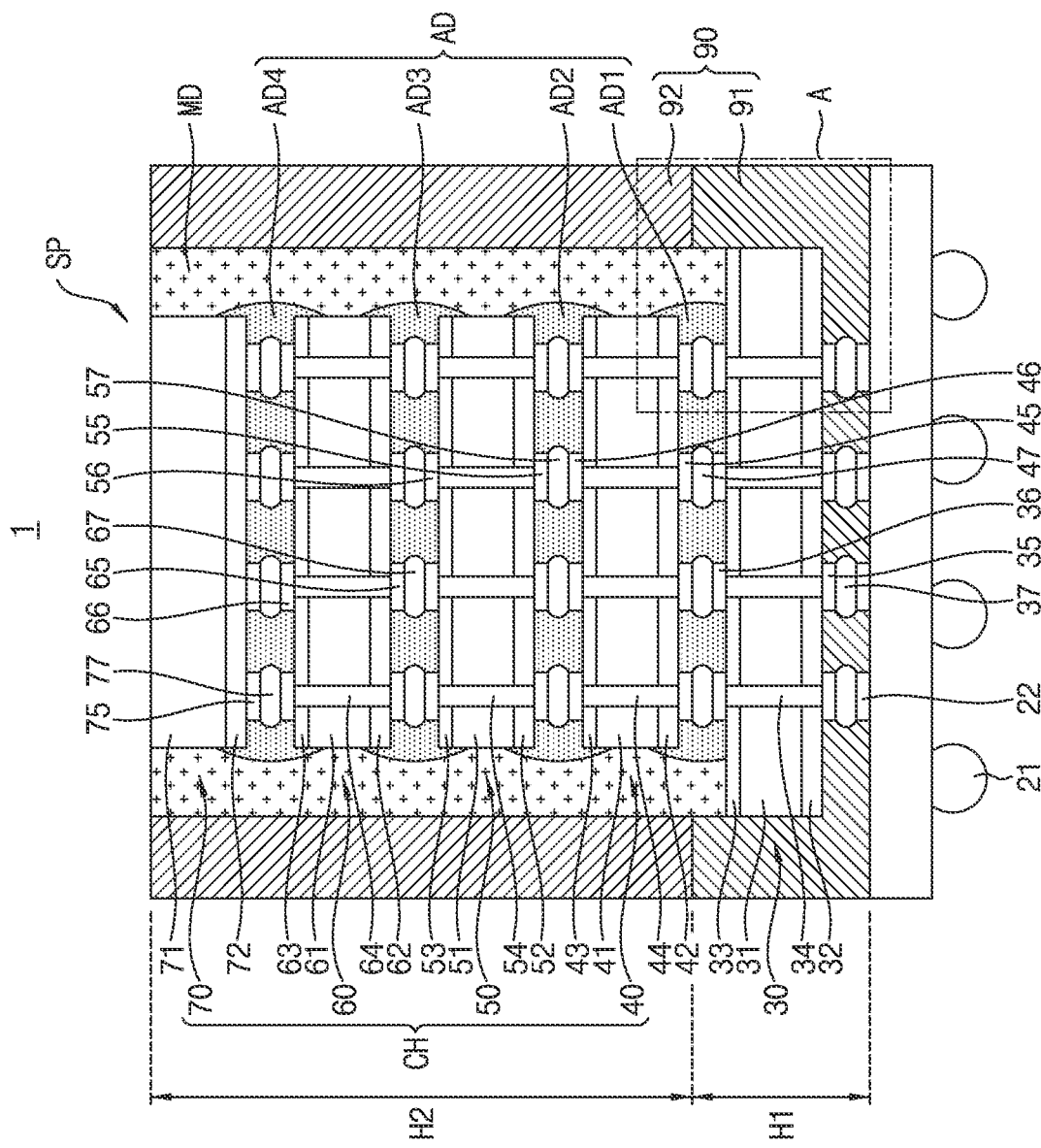
FIG. 1 is a sectional view of a semiconductor package according to an exemplary embodiment of the disclosure.

In the following detailed description, for the purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, to "directly contact" another element or component, or to be "directly disposed on" another element or component, this encompasses only cases where the two elements or components are connected to or otherwise in contact with each other without any intermediate or intervening elements or components.

Figure 2:
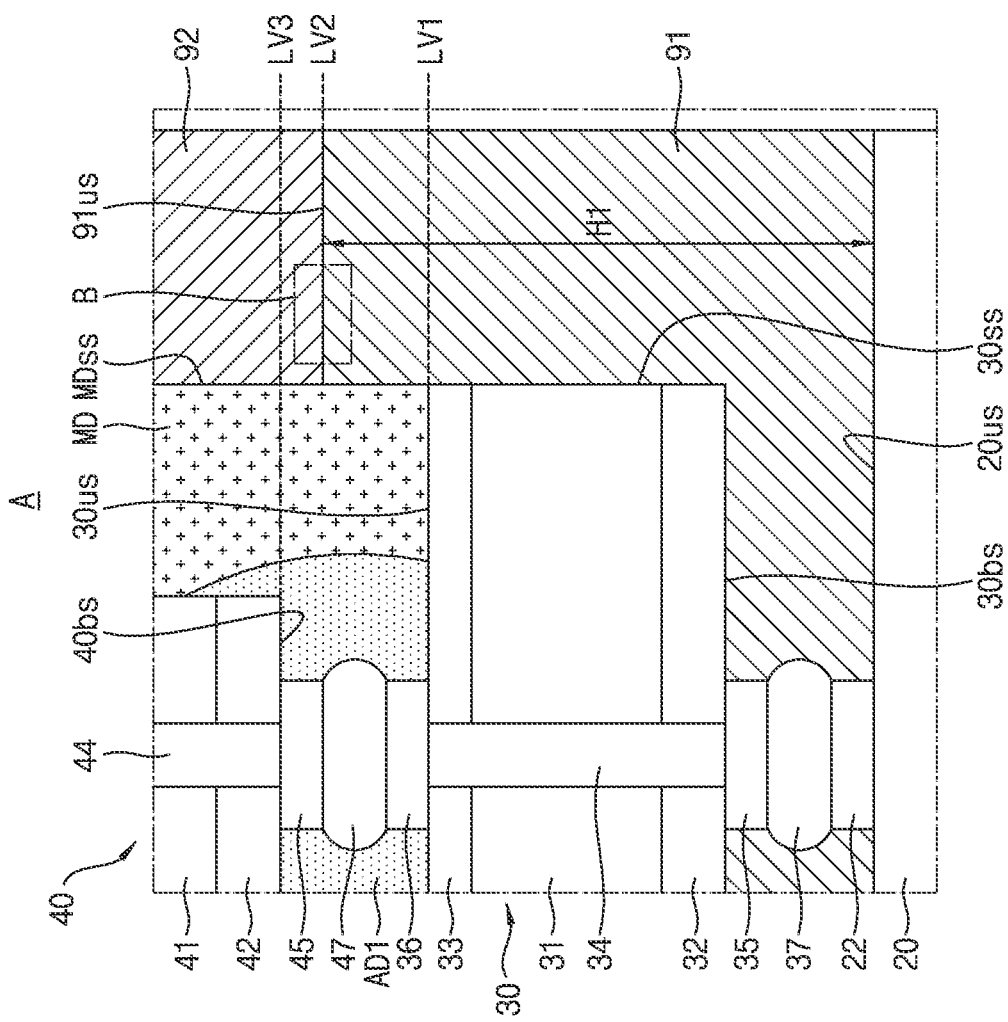
FIG. 2 is an enlarged view of a portion A of FIG. 1.
Figure 3:
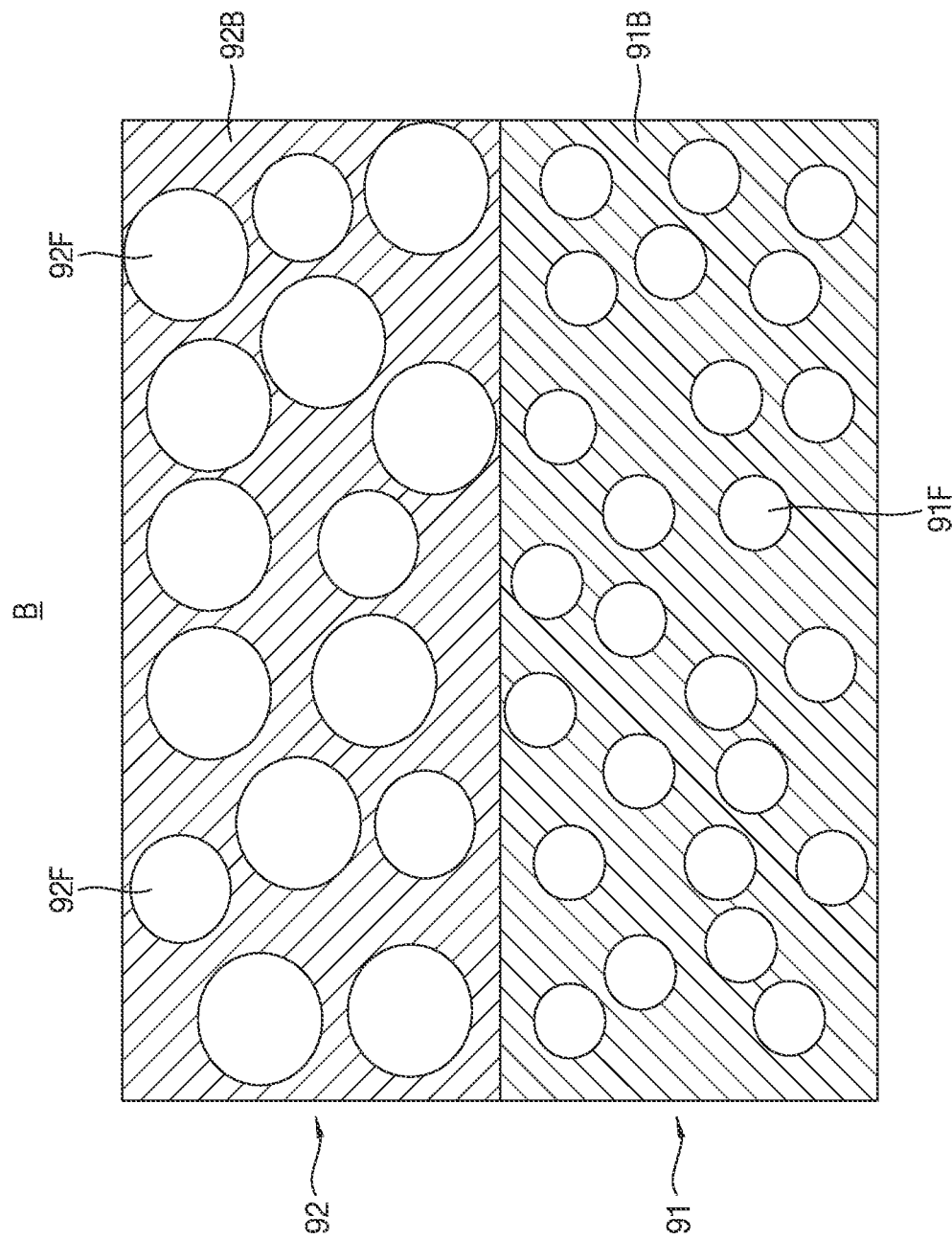
FIG. 3 is an enlarged view of a portion B of FIG. 2.

FIG. 1 is a sectional view of a semiconductor package according to an exemplary embodiment of the disclosure. FIG. 2 is an enlarged view of a portion A of FIG. 1. FIG. 3 is an enlarged view of a portion B of FIG. 2.

Referring to FIG. 1, a semiconductor package 1 may include a package substrate 20, a base chip 30, a plurality of semiconductor chips CH, a plurality of adhesive layers AD, an inner mold layer MD, and an outer mold layer 90.

The package substrate 20 may be a printed circuit board or an interposer substrate. Inner connecting terminals 21 may be disposed at a bottom surface of the package substrate 20. For example, the inner connecting terminals 21 may be solder balls. For example, the inner connecting terminals 21 may include at least one of tin and lead. One or more connecting pad(s) 22 may be disposed at an upper surface of the package substrate 20. The package substrate 20 may be electrically connected to the base chip 30 via the connecting pad(s) 22.

The base chip 30 may be disposed on the package substrate 20. The base chip 30 may include a base substrate 31, a base device layer 32, a base protective layer 33, one or more TSV(s) 34 (through-silicon vias), one or more lower connecting pad(s) 35, one or more upper connecting pad(s) 36, and one or more connecting bump(s) 37.

The base substrate 31 may include, for example, silicon. Alternatively, the base substrate 31 may include a semiconductor element such as germanium (Ge) or a compound semiconductor such as silicon carbide (SiC), gallium arsenide (GaAs), indium arsenide (InAs) and indium phosphide (InP). Otherwise, the base substrate 31 may have a silicon-on-insulator (SOI) structure. For example, the base substrate 31 may include a conductive region, for example, a well doped with an impurity or a structure doped with an impurity. In addition, the base substrate 31 may have various element isolation structures such as a shallow trench isolation (STI) structure.

The base device layer 32 may be disposed on a bottom surface of the base substrate 31 so as to effectively be under the base substrate 31. The base substrate 31 may include the bottom surface and an upper surface opposite to the bottom surface. The bottom surface of the base substrate 31 may represent a surface that faces and is directed to the package substrate 20. The base device layer 32 may cover the bottom surface of the base substrate 31 by overlapping the bottom surface of the base substrate 31. Although not clearly shown, the base device layer 32 may include a plurality of various kinds of individual devices and an interlayer insulating layer. The plurality of individual elements may include various microelectronic devices such as, for example, a metal-oxide semiconductor field effect transistor (MOSFET) such as a complementary metal-insulator-semiconductor (CMOS) transistor, etc., large scale integration (LSI), flash memory, DRAM, SRAM, EEPROM, PRAM, MRAM, RRAM, an image sensor such as a CMOS imaging sensor (CIS), etc., a microelectromechanical system (MEMS), an active device, a passive device, etc. The plurality of individual devices may be electrically connected to the conductive region of the base substrate 31. A wiring and/or plugs may be disposed in the interlayer insulating layer of the base device layer 32. The wiring and/or plugs may electrically interconnect the plurality of individual devices and the conductive region of the base substrate 31.

The base protective layer 33 may be disposed on the upper surface of the base substrate 31. The base protective layer 33 may cover the upper surface of the base substrate 31. For example, the base protective layer 33 may include an insulating polymer.

As shown in FIG. 1, the base chip 30 may include one or more instances of the TSV(s) 34, one or more corresponding instances of the lower connecting pad(s) 35, one or more corresponding instances of the upper connecting pad(s) 36, and one or more corresponding instances of the connecting bump(s) 37. Each of the TSV(s) 34 may extend through the base substrate 31 and the base protective layer 33. Each of the TSV(s) 34 may have a pillar shape. Each of the TSV(s) 34 may be connected to the wiring and/plug in the base device layer 32. For example, each of the TSV(s) 34 may include at least one material selected from Cu, a Cu alloy such as CuSn, CuMg, CuNi, CuZn, CuPd, CuAu, CuRe, CuW, etc., W, a W alloy, Ni, Ru, and Co.

Each of the lower connecting pad(s) 35 may be disposed on a bottom surface of the base chip 30. Each of the lower connecting pad(s) 35 may be disposed on a bottom surface of the base device layer 32. Each of the lower connecting pad(s) 35 may be electrically connected to the wiring and/or plug in the base device layer 32. Each of the lower connecting pad(s) 35 may be electrically connected to a corresponding one of the TSV(s) 34 via the wiring and/or plugs in the base device layer 32. For example, each of the lower connecting pad(s) 35 may include at least one of Al, Cu, Ni, W, Pt, and Au.

Each of the upper connecting pad(s) 36 may be disposed on an upper surface of the base chip 30. Each of the upper connecting pad(s) 36 may be disposed on an upper surface of the base protective layer 33. Each of the upper connecting pad(s) 36 may be electrically connected to a corresponding one of the TSV(s) 34. For example, each of the upper connecting pad(s) 36 may include at least one of Al, Cu, Ni, W, Pt, and Au.

Each of the connecting bump(s) 37 may be disposed on a corresponding one of the lower connecting pad(s) 35. Each of the connecting bump(s) 37 may be disposed between the package substrate 20 and the base substrate 31 and, as such, may electrically interconnect the package substrate 20 and the base substrate 31. Each of the connecting bump(s) 37 may be directly connected to a corresponding one of the lower connecting pad(s) 35, and may be directly connected to a corresponding one of the connecting pad(s) 22 of the package substrate 20. Each of the connecting bump(s) 37 may be electrically connected to a corresponding one of the TSV(s) 34 via a corresponding one of the lower connecting pad(s) 35. For example, each connecting bump(s) 37 may include tin or lead.

In an embodiment, the base chip 30 may be a dummy semiconductor chip in which the base device layer 32 does not include a plurality of individual devices. The base chip 30 may be a buffer chip which may receive, from the exterior thereof, at least one of a control signal, a power signal, or a ground signal for operation of the plurality of semiconductor chips CH disposed on the base chip 30, may receive, from the exterior thereof, a data signal to be stored in the plurality of semiconductor chips CH, or may provide, to the exterior thereof, data stored in the plurality of semiconductor chips CH.

The plurality of semiconductor chips CH may be disposed on the base chip 30. In an embodiment, the plurality of semiconductor chips CH may include a first semiconductor chip 40, a second semiconductor chip 50, a third semiconductor chip 60, and a fourth semiconductor chip 70. Although FIG. 1 shows that four semiconductor chips are disposed on the base chip 30, the exemplary embodiments of the disclosure are not limited thereto. The number of the plurality of semiconductor chips CH may be less than or more than 4.

For example, one or more of the plurality of semiconductor chips CH may be a memory semiconductor chip. For example, one or more of the memory semiconductor chip may be a volatile memory semiconductor chip such as dynamic random access memory (DRAM) or static random access memory (SRAM), or a non-volatile memory semiconductor chip such as phase-change random access memory (PRAM), magnetoresistive random access memory (MRAM), ferroelectric random access memory (FeRAM) or resistive random access memory (RRAM). In some embodiments, one or more of the plurality of semiconductor chips CH may be a high bandwidth memory (HBM) DRAM semiconductor chip. In some embodiments, at least one of the plurality of semiconductor chips CH may be a logic semiconductor chip.

The first semiconductor chip 40 may be disposed on the base chip 30. The first semiconductor chip 40 may have a smaller size than the base chip 30. The first semiconductor chip 40 may have a smaller area than the base chip 30 such as by having one or more smaller comparable dimensions relative to the base chip 30. Accordingly, the first semiconductor chip 40 may completely overlap with the base chip 30 in a vertical direction, or a portion of the base chip 30 may not overlap with the first semiconductor chip 40 in the vertical direction.

The first semiconductor chip 40 may include a first semiconductor substrate 41, a first semiconductor device layer 42, a first protective layer 43, one or more first TSV(s) 44, one or more first lower connecting pad(s) 45, one or more first upper connecting pad(s) 46, and one or more first connecting bump(s) 47. As shown in FIG. 1, individual instances of each of the first TSV(s) 44, the first lower connecting pad(s) 45, the first upper connecting pad(s) 46 and the first connecting bump(s) 47 may be provided on a corresponding basis such that in FIG. 1 there are four sets of these elements. The first semiconductor chip 40 may have characteristics identical or similar to those of the base chip 30.

A first adhesive layer AD1 may be interposed between the base chip 30 and the first semiconductor chip 40. The first adhesive layer AD1 may cover a portion of the upper surface of the base chip 30. The first adhesive layer AD1 may also expose a portion of the upper surface of the base chip 30 without covering the exposed portion of the upper surface. The first adhesive layer AD1 may directly contact the base protective layer 33 of the base chip 30. The first adhesive layer AD1 may completely cover an exposed bottom surface of the first semiconductor chip 40. The first adhesive layer AD1 may partially cover a side surface of the first semiconductor chip 40. The first adhesive layer AD1 may cover at least a portion of the first semiconductor device layer 42 of the first semiconductor chip 40. The first adhesive layer AD1 may cover each of the upper connecting pad(s) 36 of the base chip 30, and each of the first connecting bump(s) 47 and each of the first lower connecting pad(s) 45 of the first semiconductor chip 40 by overlapping these elements in at least one direction (to the right and left in FIG. 1).

The second semiconductor chip 50 may include a second semiconductor substrate 51, a second semiconductor layer 52, a second protective layer 53, one or more second TSV(s) 54, one or more second lower connecting pad(s) 55, one or more second upper connecting pad(s) 56, and one or more second connecting bump(s) 57. The second semiconductor chip 50 may have characteristics identical or similar to those of the base chip 30.

A second adhesive layer AD2 may be interposed between the first semiconductor chip 40 and the second semiconductor chip 50. The second adhesive layer AD2 may completely cover an exposed upper surface of the first semiconductor chip 40. The second adhesive layer AD2 may directly contact the first protective layer 43 of the first semiconductor chip 40. The second adhesive layer AD2 may completely cover an exposed bottom surface of the second semiconductor chip 50. The second adhesive layer AD2 may cover at least a portion of the second semiconductor layer 52 of the second semiconductor chip 50. The second adhesive layer AD2 may cover a portion of the side surface of the first semiconductor chip 40 and a portion of a side surface of the second semiconductor chip 50. The second adhesive layer AD2 may cover each of the first upper connecting pad(s) 46 of the first semiconductor chip 40 and each of the second connecting bump(s) 57 and each of the second lower connecting pad(s) 55 of the second semiconductor chip 50.

The third semiconductor chip 60 may include a third semiconductor substrate 61, a third semiconductor device layer 62, a third protective layer 63, one or more third TSV(s) 64, one or more third lower connecting pad(s) 65, one or more third upper connecting pad(s) 66, and one or more third connecting bump(s) 67. The third semiconductor chip 60 may have characteristics identical or similar to those of the base chip 30. A third adhesive layer AD3 may be interposed between the second semiconductor chip 50 and the third semiconductor chip 60. The third adhesive layer AD3 may have characteristics identical or similar to those of the second adhesive layer AD2.

The fourth semiconductor chip 70 may include a fourth semiconductor substrate 71, a fourth semiconductor device layer 72, one or more fourth lower connecting pad(s) 75, and one or more fourth connecting bump(s) 77. The fourth semiconductor chip 70 may not include a TSV and a protective layer, differently from the base chip 30 and the first semiconductor chip 40, second semiconductor chip 50 and third semiconductor chip 60. A fourth adhesive layer AD4 may be interposed between the third semiconductor chip 60 and the fourth semiconductor chip 70. The fourth adhesive layer AD4 may have characteristics identical or similar to those of the second adhesive layer AD2.

Referring to FIG. 1 and FIG. 2, the inner mold layer MD may be disposed on the base chip 30. The inner mold layer MD may cover an exposed portion of an upper surface 30us of the base chip 30. The inner mold layer MD may directly contact the base protective layer 33 of the base chip 30. The inner mold layer MD may cover side surfaces of the adhesive layers AD and side surfaces of the semiconductor chips CH. The inner mold layer MD may surround the side surfaces of the adhesive layers AD and the side surfaces of the semiconductor chips CH. A side surface of the inner mold layer MD may be coplanar or otherwise congruous with a side surface of the base chip 30. The inner mold layer MD may include an insulating polymer material. For example, the inner mold layer MD may include an epoxy molding compound (EMC).

The outer mold layer 90 may be disposed on the package substrate 20. The outer mold layer 90 may cover the base chip 30 and the inner mold layer MD on sides as shown in FIG. 1. The outer mold layer 90 may also cover the package substrate 20 on the top as shown in FIG. 1.

The outer mold layer 90 may include a first outer mold layer 91 and a second outer mold layer 92. Each of the first outer mold layer 91 and the second outer mold layer 92 may include an insulating polymer material. For example, each of the first outer mold layer 91 and the second outer mold layer 92 may include an epoxy molding compound (EMC). The first outer mold layer 91 may constitute a lower portion of the outer mold layer 90, and the second outer mold layer 92 may constitute an upper portion of the outer mold layer 90. The first outer mold layer 91 may be directly disposed on the package substrate 20, and the second outer mold layer 92 may be disposed on the first outer mold layer 91. The second outer mold layer 92 may be spaced apart from the package substrate 20, with the first outer mold layer 91 interposed therebetween.

The first outer mold layer 91 may be interposed between the package substrate 20 and the base chip 30. The first outer mold layer 91 may completely fill a space between the package substrate 20 and the base chip 30. The first outer mold layer 91 may overlap with the base chip 30, the plurality of semiconductor chips CH, the plurality of adhesive layers AD and the inner mold layer MD in the vertical direction. The first outer mold layer 91 may completely cover an upper surface 20us of the package substrate 20 that is not otherwise covered by the connecting pad(s) 22. The first outer mold layer 91 may contact the upper surface 20us of the package substrate 20. The first outer mold layer 91 may directly contact one or more connecting pad(s) 22 of the package substrate 20, and one or more connecting bump(s) 37 and one or more lower connecting pad(s) 35 of the base chip 30.

In some embodiments, the first outer mold layer 91 covers the lower connecting pad(s) 35 and the connecting bump(s) 37, such as by overlapping the lower connecting pad(s) 35 and the connecting bump(s) 37 in one or more direction(s) such as to the right and left in FIG. 1. In some embodiments, the first outer mold layer 91 covers the base substrate 31, the base device layer 32 and the base protective layer 33, such as by overlapping the base substrate 31, the base device layer 32 and the base protective layer 33 in one or more directions such as to the right and left in FIG. 1.

The first outer mold layer 91 may cover a bottom surface 30bs from below and a side surface 30ss of the base chip 30 from the side. The first outer mold layer 91 may contact the bottom surface 30bs and the side surface 30ss of the base chip 30. The first outer mold layer 91 may completely cover the bottom surface 30bs of the base chip 30 that is otherwise not covered by the lower connecting pad(s) 35. The first outer mold layer 91 may surround the side surface 30ss of the base chip 30. The first outer mold layer 91 may surround a portion of a side surface MDss of the inner mold layer MD. The first outer mold layer 91 may cover a portion of the side surface MDss of the inner mold layer MD. The first outer mold layer 91 may directly contact a portion of the side surface MDss of the inner mold layer MD.

In an embodiment, a level LV2 of an upper surface 91us of the first outer mold layer 91 may be higher than a level LV1 of the upper surface 30us of the base chip 30 while being lower than a level LV3 of a bottom surface 40bs of the first semiconductor chip 40 in a comparative dimension. Levels described in the specification may be compared with reference to the upper surface 20us of the package substrate 20. For example, a thickness H1 of the first outer mold layer 91 may be about 5 to 100 μm. Here, the thickness H1 of the first outer mold layer 91 may mean a vertical distance from the upper surface 20us of the package substrate 20 to the upper surface 91us of the first outer mold layer 91.

The second outer mold layer 92 may be disposed on the first outer mold layer 91. The second outer mold layer 92 may cover an upper surface 91us of the first outer mold layer 91 from above and a portion of the side surface MDss of the inner mold layer MD from the sides. The second outer mold layer 92 may be spaced apart from the base chip 30. A thickness H2 of the second outer mold layer 92 may differ from the thickness H1 of the first outer mold layer 91 in a dimension measured relative to the package substrate 20. In an embodiment, the thickness H2 of the second outer mold layer 92 may be greater than the thickness H1 of the first outer mold layer 91. For example, the thickness H2 of the second outer mold layer 92 may exceed 100 μm.

In an embodiment, the viscosity of the first outer mold layer 91 may differ from the viscosity of the second outer mold layer 92. For example, the viscosity of the first outer mold layer 91 may be lower than the viscosity of the second outer mold layer 92. In an embodiment, the Young's modulus of the first outer mold layer 91 may differ from the Young's modulus of the second outer mold layer 92. For example, the Young's modulus of the first outer mold layer 91 may be smaller than the Young's modulus of the second outer mold layer 92.

In an embodiment, the vertical distance between the package substrate 20 and the base chip 30 may differ from the vertical distance between the base chip 30 and the first semiconductor chip 40. The vertical distance between the package substrate 20 and the base chip 30 may differ from the vertical distance between adjacent ones of the plurality of semiconductor chips CH. Here, the vertical distance between the package substrate 20 and the base chip 30 may mean the vertical distance between the upper surface 20us of the package substrate 20 and the bottom surface 30bs of the base chip 30. The vertical distance between the base chip 30 and the first semiconductor chip 40 may mean the vertical distance between the upper surface 30us of the base chip 30 and the bottom surface 40bs of the first semiconductor chip 40. The vertical distance between the package substrate 20 and the base chip 30 may be greater than the vertical distance between the base chip 30 and the first semiconductor chip 40. The vertical distance between the package substrate 20 and the base chip 30 may be greater than the vertical distance between adjacent ones of the plurality of semiconductor chips CH. For example, the vertical distance between the package substrate 20 and the base chip 30 may be about 60 to 80 μm.

Referring to FIG. 3, the first outer mold layer 91 may include a first base material 91B and first fillers 91F, and the second outer mold layer 92 may include a second base material 92B and second fillers 92F.

The first fillers 91F may be filler particles distributed in the first base material 91B. The first base material 91B may include at least one polymer material. The first fillers 91F may include a material such as silica or alumina. The second fillers 92F may be filler particles distributed in the second base material 92B. The second base material 92B may include at least one polymer material. The second filler 92F may include a material such as silica or alumina.

In an embodiment, the first base material 91B and the second base material 92B may be different materials, respectively. The viscosity of the first base material 91B may be lower than the viscosity of the second base material 92B. The lowest viscosity (or the highest viscosity) of the first base material 91B at a predetermined temperature may be lower than the lowest viscosity (or the highest viscosity) of the second base material 92B at the predetermined temperature. For example, the viscosity of the first base material 91B may be 50 Pa·s or less at 100° C., and the viscosity of the second base material 92B may exceed 50 Pa·s at 100° C.

In an embodiment, the average size of the first fillers 91F may differ from the average size of the second fillers 92F. The average size of the first fillers 91F may be smaller than the average size of the second fillers 92F. Here, the average size of the first fillers 91F may be the average diameter of the first fillers 91F, and the average size of the second fillers 92F may be the average diameter of the second fillers 92F. The average size of the first fillers 91F may be 10 μm or less. For example, the average size of the first fillers 91F may be about 3 to 7 μm. The average size of the second fillers 92F may exceed about 10 μm.

In the case of FIG. 1, the base chip 30, the plurality of semiconductor chips CH, the plurality of adhesive layers AD, and the inner mold layer MD may constitute one semiconductor package SP. The semiconductor package SP may be referred to as a "sub-semiconductor package SP".

Figure 4:
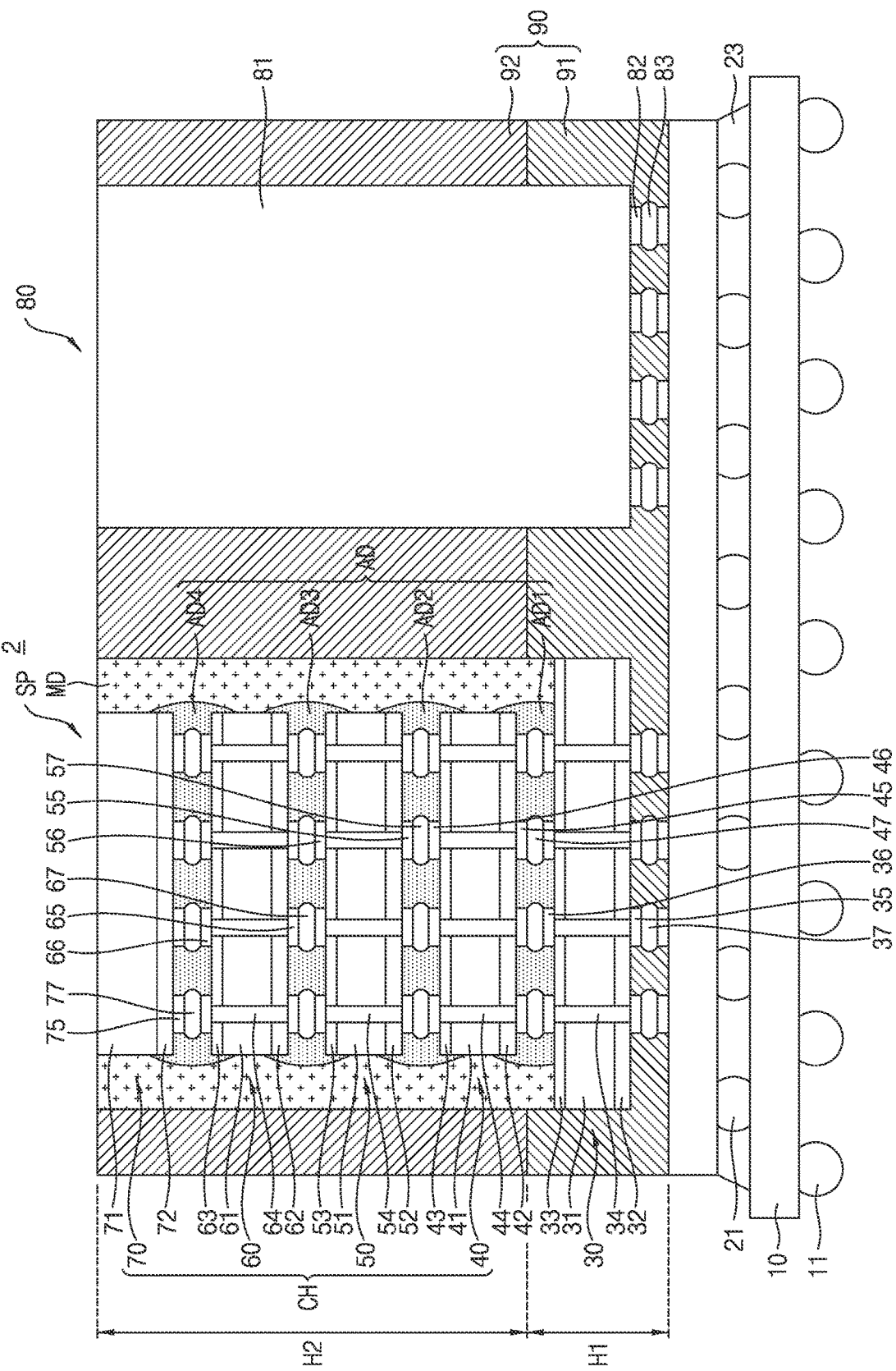
FIG. 4 is a sectional view of a semiconductor package according to an exemplary embodiment of the disclosure.

FIG. 4 is a sectional view of a semiconductor package according to an exemplary embodiment of the disclosure.

Referring to FIG. 4, a semiconductor package 2 may include a first package substrate 10, a second package substrate 20, a sub-semiconductor package SP, a main semiconductor chip 80, and an outer mold layer 90. The semiconductor package 2 shown in FIG. 4 may further include the first package substrate 10 and the main semiconductor chip 80, as compared to the semiconductor package 1 shown in FIG. 1. The second package substrate 20 of the semiconductor package 2 may correspond to the package substrate 20 of the semiconductor package 1 of FIG. 1. The sub-semiconductor package SP of the semiconductor package 2 may include a base chip 30, first semiconductor chip 40, second semiconductor chip 50, third semiconductor chip 60 and fourth semiconductor chip 70, first adhesive layer AD1, second adhesive layer AD2, third adhesive layer AD3, and fourth adhesive layer AD4. An inner mold layer MD, and the constituent elements of the sub-semiconductor package SP may have the same characteristics as the constituent elements of the semiconductor package 1 of FIG. 1, respectively.

The first package substrate 10 may be a printed circuit board. Outer connecting terminals 11 may be connected to a bottom surface of the first package substrate 10. For example, the outer connecting terminals 11 may be solder balls. For example, the outer connecting terminals 11 may include at least one of tin and lead.

The second package substrate 20 may be disposed on the first package substrate 10. The second package substrate 20 may be an interposer substrate. Inner connecting terminals 21 may be disposed at a bottom surface of the second package substrate 20. The inner connecting terminals 21 may be connected to an upper surface of the first package substrate 10. The second package substrate 20 may be mounted on the first package substrate 10 through the inner connecting terminals 21. The second package substrate 20 may be electrically connected to the first package substrate 10 via the inner connecting terminals 21. The inner connecting terminals 21 may be at least one of a solder ball, a conductive bump, and a conductive pillar. For example, the inner connecting terminals 21 may include at least one of tin and lead. An underfill layer 23 may be interposed between the first package substrate 10 and the second package substrate 20. The underfill layer 23 may cover sides of the inner connecting terminals 21. For example, the underfill layer 23 may include a thermosetting resin or a photosetting resin. The underfill layer 23 may further include an organic filler or an inorganic filler.

The sub-semiconductor package SP may be disposed on the second package substrate 20. The sub-semiconductor package SP may include a base chip 30 and a plurality of semiconductor chips CH, which are vertically stacked. The base chip 30 may be disposed on the second package substrate 20, and the plurality of semiconductor chips CH may be vertically stacked on the base chip 30. Although FIG. 4 shows that four semiconductor chips are disposed on the base chip 30, the exemplary embodiments of the disclosure are not limited thereto. The number of the plurality of semiconductor chips CH may be more or less than 4.

For example, one or more of the base chip 30 and/or the plurality of semiconductor chips CH may each be a memory semiconductor chip. For example, the memory semiconductor chip may be a volatile memory semiconductor chip such as dynamic random access memory (DRAM) or static random access memory (SRAM), or a non-volatile memory semiconductor chip such as phase-change random access memory (PRAM), magnetoresistive random access memory (MRAM), ferroelectric random access memory (FeRAM) or resistive random access memory (RRAM). In some embodiments, the base chip 30 and/or the plurality of semiconductor chips CH may be a high bandwidth memory (HBM) DRAM semiconductor chip. In an embodiment, at least one of the base chip 30 and/or the plurality of semiconductor chips CH may be a logic semiconductor chip.

The main semiconductor chip 80 may be disposed on the second package substrate 20 while being spaced apart from the sub-semiconductor package SP in a direction to the left in FIG. 4. The main semiconductor chip 80 may include a main semiconductor substrate 81, one or more connecting pad(s) 82, and one or more connecting bump(s) 83. The connecting pad(s) 82 may be disposed at a bottom surface of the main semiconductor substrate 81. The connecting bump(s) 83 may be disposed between the main semiconductor substrate 81 and the second package substrate 20. The connecting bump(s) 83 may be connected to the connecting pad(s) 82 of the main semiconductor chip 80 and the connecting pad(s) 22 of the second package substrate 20.

For example, the main semiconductor chip 80 may be a processor unit. The main semiconductor chip 80 may be, for example, a microprocessor unit (MPU) or a graphics processing unit (GPU). In some embodiments, the main semiconductor chip 80 may be a package verified as operating normally, that is, a known good package.

The outer mold layer 90 may be disposed on the second package substrate 20. The outer mold layer 90 may include a first outer mold layer 91 and a second outer mold layer 92. The first outer mold layer 91 and the second outer mold layer 92 may have the same characteristics as the first outer mold layer 91 and the second outer mold layer 92 described with reference to FIGS. 1 to 3, respectively, except that the first outer mold layer 91 and the second outer mold layer 92 contact the main semiconductor chip 80 in FIG. 4. In an embodiment, the first outer mold layer 91 may cover a lower portion of the main semiconductor chip 80 from below and from portions of the sides. For example, the first outer mold layer 91 may cover at least a portion of a side surface of the main semiconductor chip 80. The first outer mold layer 91 may be interposed between the main semiconductor chip 80 and the second package substrate 20. The first outer mold layer 91 may cover the entirety of portions of the bottom surface of the main semiconductor chip 80 not otherwise covered by the connecting pad(s) 82. The first outer mold layer 91 may completely fill a space between the main semiconductor chip 80 and the second package substrate 20. The first outer mold layer 91 may vertically overlap with the main semiconductor chip 80. The first outer mold layer 91 may contact the connecting pad(s) 82 and the connecting bump(s) 83 of the main semiconductor chip 80. The first outer mold layer 91 may contact the connecting pad(s) 22 of the second package substrate 20.

Figure 5:
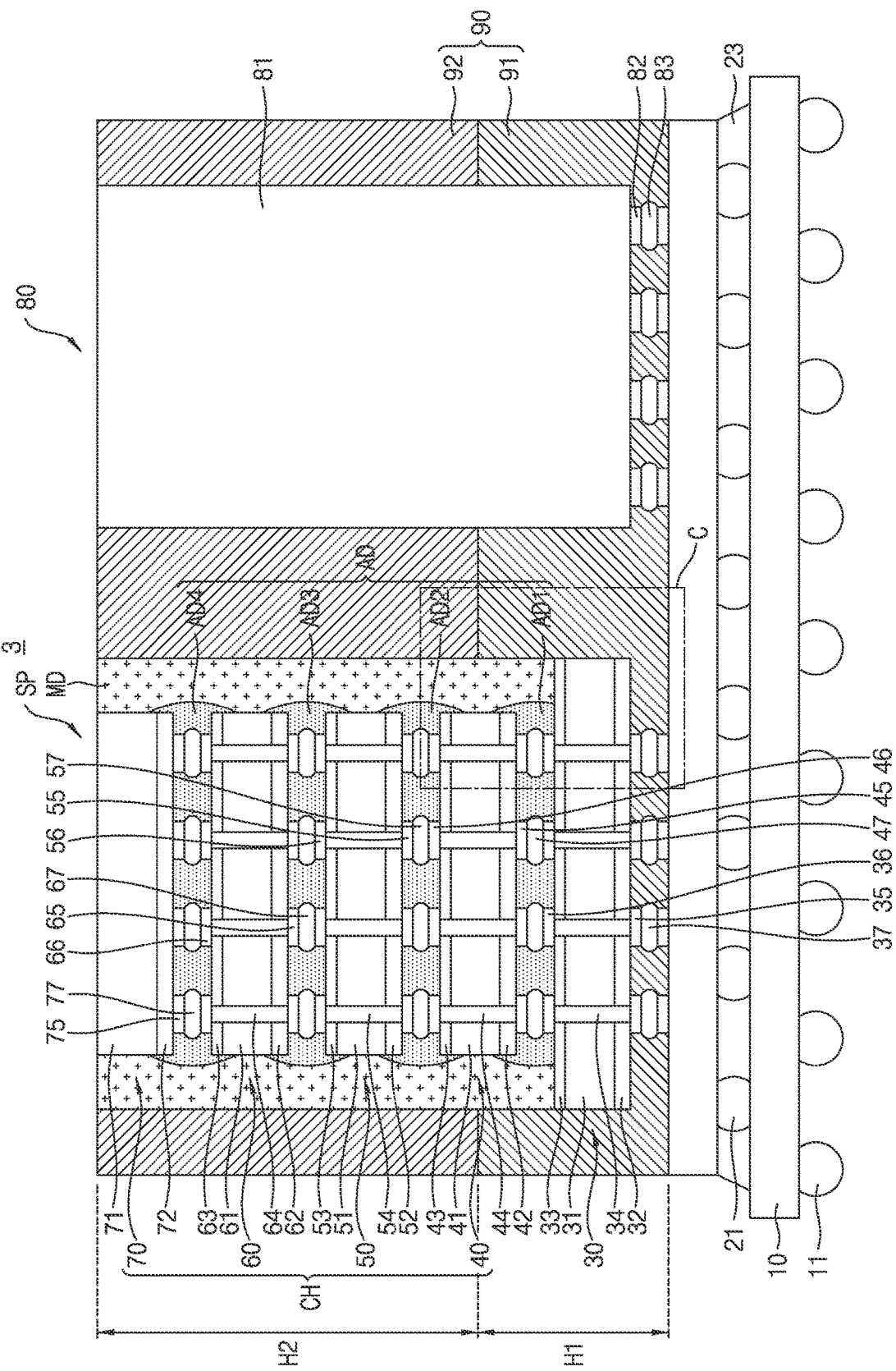
FIG. 5 is a sectional view of a semiconductor package according to an exemplary embodiment of the disclosure.
Figure 6:
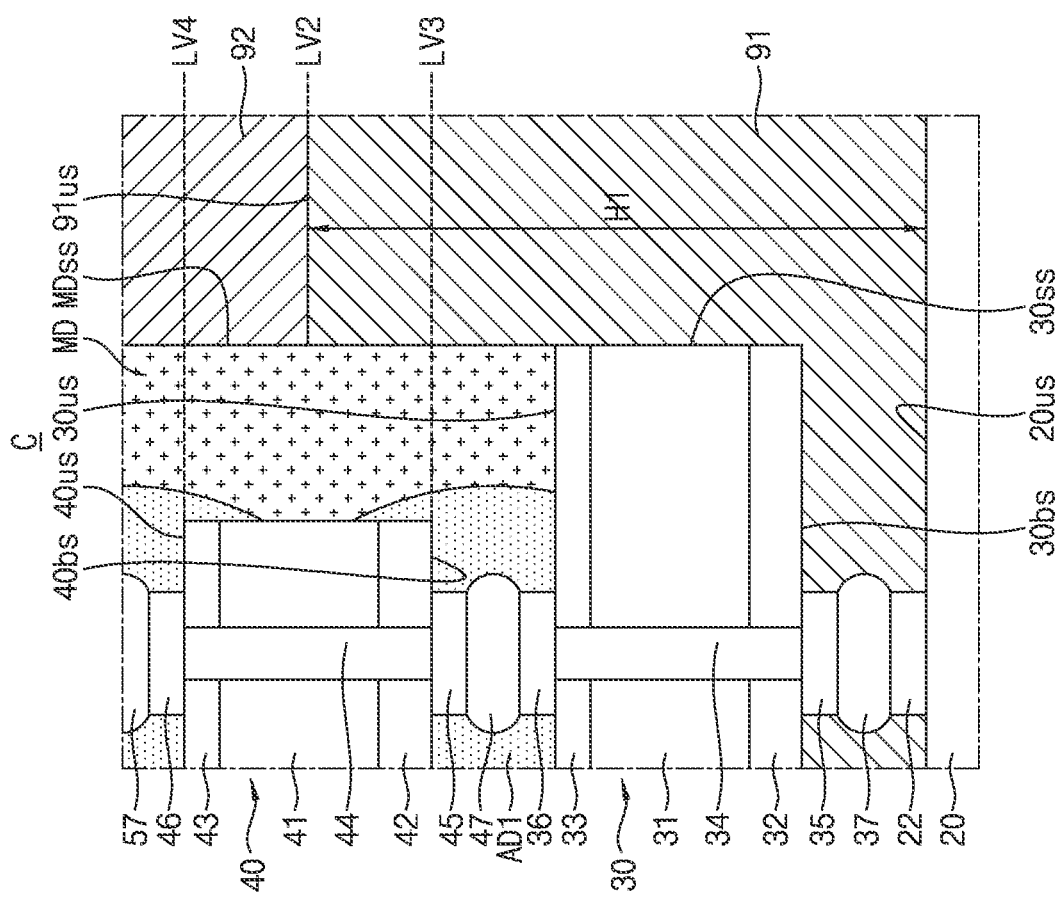
FIG. 6 is an enlarged view of a portion C of FIG. 5.

FIG. 5 is a sectional view of a semiconductor package according to an exemplary embodiment of the disclosure. FIG. 6 is an enlarged view of a portion C of FIG. 5.

Referring to FIGS. 5 and 6, a semiconductor package 3 may have the same characteristics as the semiconductor package 2 of FIG. 4, except that a thickness H1 of a first outer mold layer 91 and a thickness H2 of a second outer mold layer 92 are varied.

In an embodiment, a level LV2 of an upper surface 91us of the first outer mold layer 91 may be higher than a level LV3 of a bottom surface 40bs of a first semiconductor chip 40 while being lower than a level LV4 of an upper surface 40us of the first semiconductor chip 40. For example, the level LV2 of the upper surface 91us of the first outer mold layer 91 may be higher than the level of an upper surface of a first semiconductor device layer 42. For example, the thickness H1 of the first outer mold layer 91 may be 5 to 100 μm.

Although not shown, in an embodiment, the level LV2 of the upper surface 91us of the first outer mold layer 91 may be higher than the level LV4 of the upper surface 40us of the first semiconductor chip 40. The thickness H1 of the first outer mold layer 91 may be smaller than the thickness H2 of the second outer mold layer 92. For example, the thickness H1 of the first outer mold layer 91 may be 5 to 100 μm, and the thickness H2 of the second outer mold layer 92 may exceed 100 μm.

Figure 7:
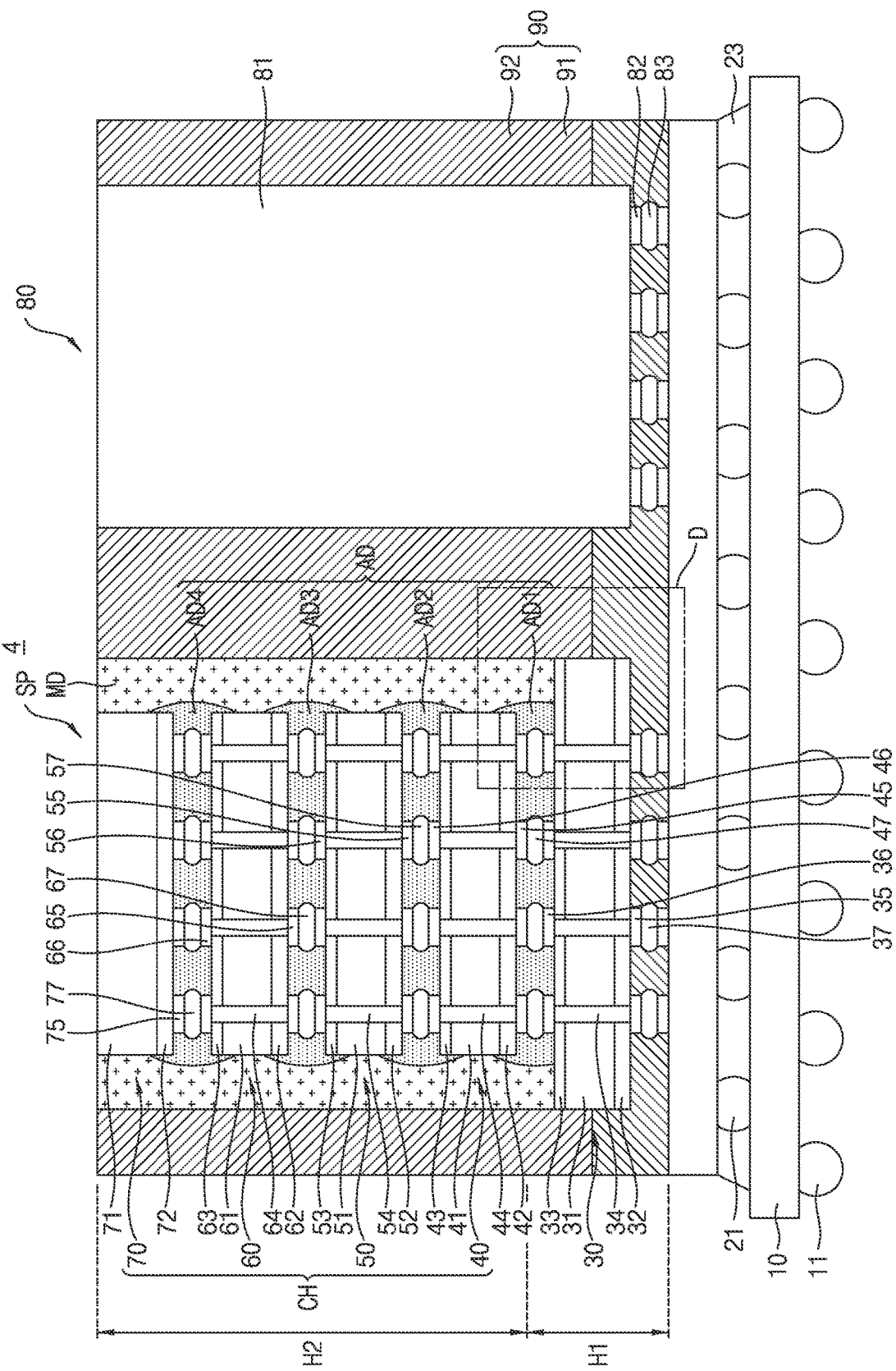
FIG. 7 is a sectional view of a semiconductor package according to an exemplary embodiment of the disclosure.
Figure 8:
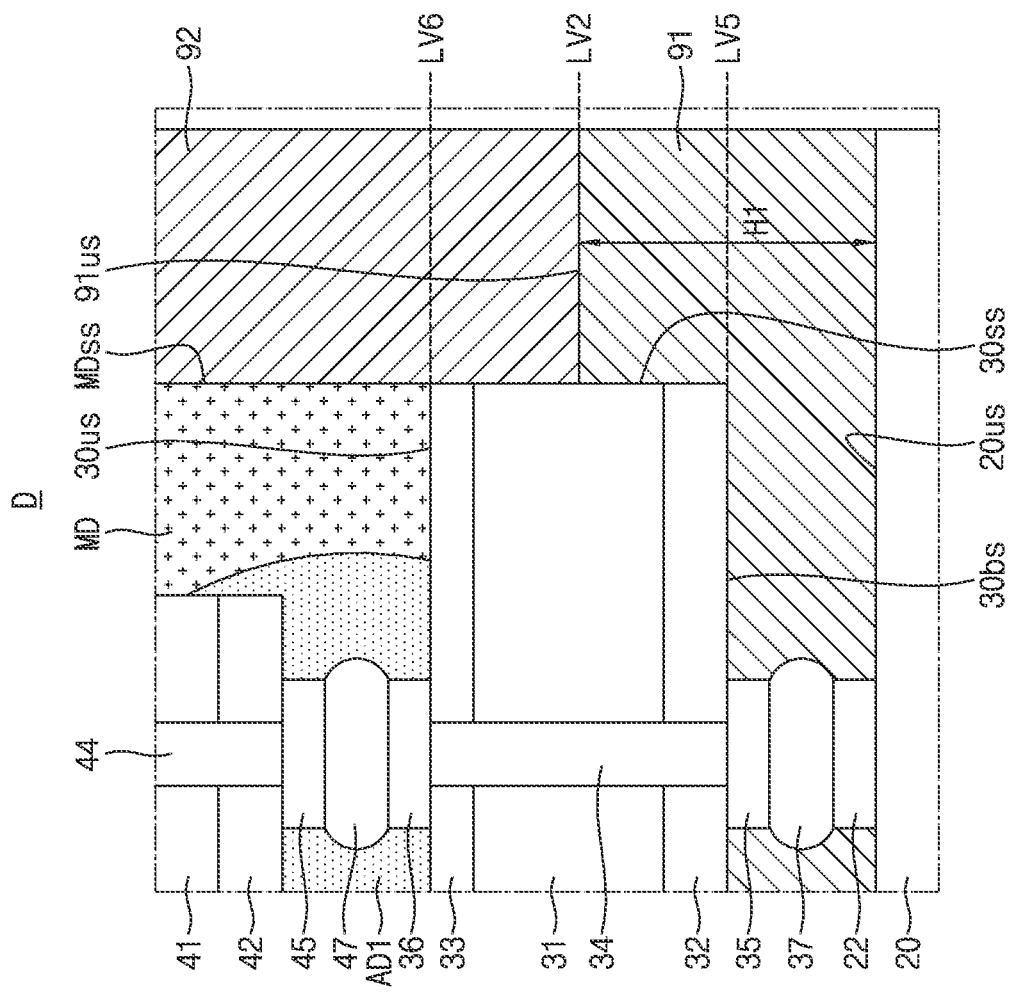
FIG. 8 is an enlarged view of a portion D of FIG. 7.

FIG. 7 is a sectional view of a semiconductor package according to an exemplary embodiment of the disclosure. FIG. 8 is an enlarged view of a portion D of FIG. 7.

Referring to FIGS. 7 and 8, a semiconductor package 4 may have the same characteristics as the semiconductor package 2 of FIG. 4, except that a thickness H1 of a first outer mold layer 91 and a thickness H2 of a second outer mold layer 92 are varied.

In an embodiment, a level LV2 of an upper surface 91us of the first outer mold layer 91 may be higher than a level LV5 of a bottom surface 30bs of a base chip 30 while being lower than a level LV6 of an upper surface 30us of the base chip 30. For example, the level LV2 of the upper surface 91us of the first outer mold layer 91 may be higher than a middle level between the level LV5 of the bottom surface 30bs of the base chip 30 and the level LV6 of the upper surface 30us of the base chip 30. Here, the level LV6 corresponds to the upper surface 30us of the base chip 30 and the level LV5 corresponds to the bottom surface 30*bs* of the base chip. The middle level may be a level that is ½ of the distance between LV6 and LV5. The first outer mold layer 91 may cover a portion of a side surface 30*ss* of the base chip 30. The first outer mold layer 91 may be spaced apart from an inner mold layer MD. The second outer mold layer 92 may cover a portion of the side surface 30*ss* of the base chip 30 and a side surface MD*ss* of the inner mold layer MD.

Figure 9:
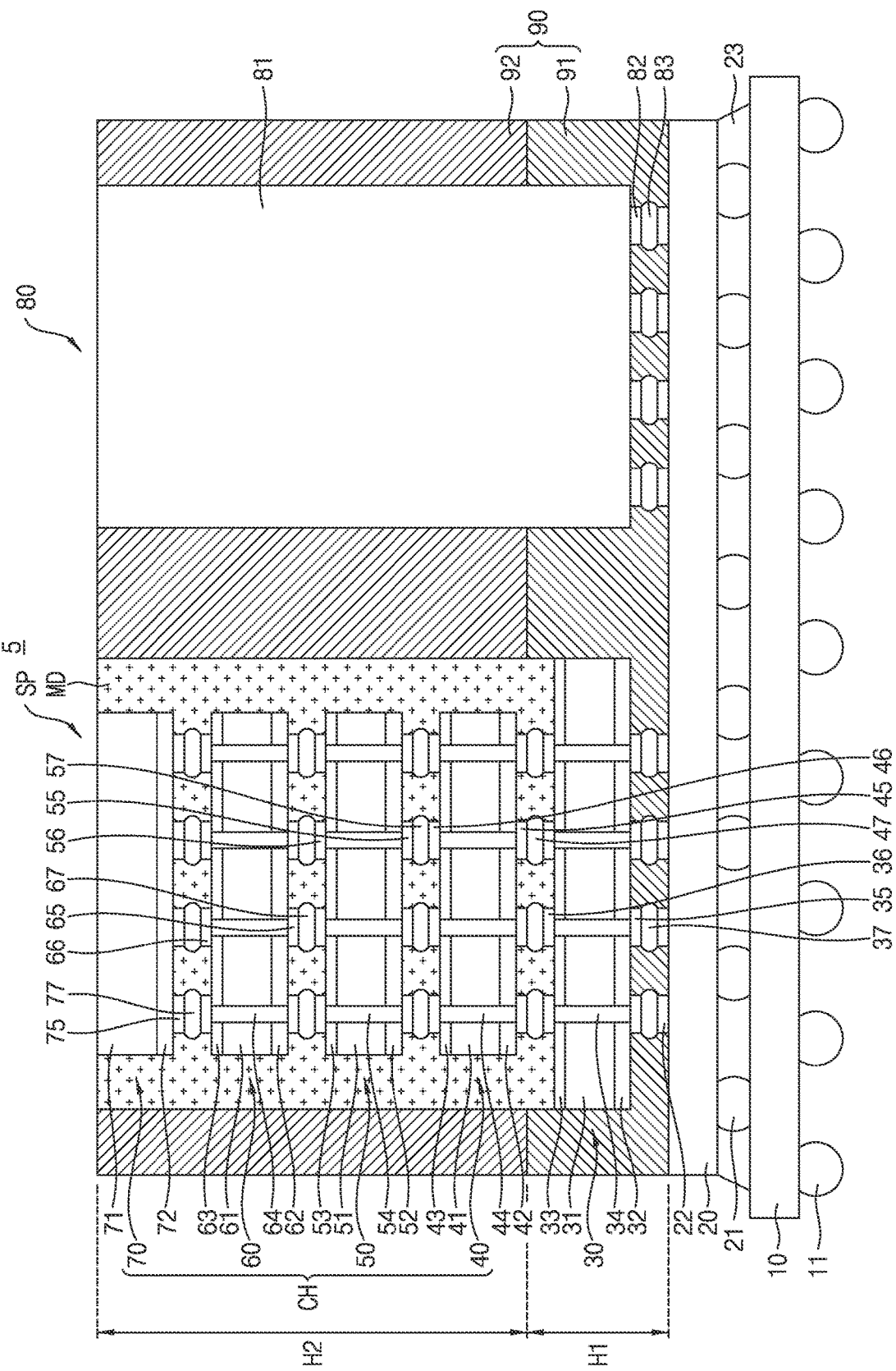
FIG. 9 is a sectional view of a semiconductor package according to an exemplary embodiment of the disclosure.

FIG. 9 is a sectional view of a semiconductor package according to an exemplary embodiment of the disclosure.

Referring to FIG. 9, a semiconductor package 5 may have the same characteristics as the semiconductor package 2 of FIG. 4, except that the semiconductor package 5 does not include a plurality of adhesive layers AD. Although not shown, the semiconductor package 5 may have the same characteristics as the semiconductor package 3 of FIG. 5 or the semiconductor package 4 of FIG. 7, except that the semiconductor package 5 does not include a plurality of adhesive layers AD. An inner mold layer MD may be interposed among a base chip 30 and a plurality of semiconductor chips CH. The inner mold layer MD may vertically overlap with the base chip 30 and the plurality of semiconductor chips CH.

The inner mold layer MD may be disposed between the base chip 30 and a first semiconductor chip 40. The inner mold layer MD may completely cover an exposed upper surface of the base chip 30 and an exposed bottom surface of the first semiconductor chip 40. The inner mold layer MD may directly contact one or more upper connecting pad(s) 36 of the base chip 30, and one of the first lower connecting pad(s) 45 and one or more first connecting bump(s) 47 of the first semiconductor chip 40.

The inner mold layer MD may be interposed between the first semiconductor chip 40 and a second semiconductor chip 50. The inner mold layer MD may completely cover an exposed upper surface of the first semiconductor chip 40 and an exposed bottom surface of the second semiconductor chip 50. The inner mold layer MD may directly contact one or more first upper connecting pad(s) 46 of the first semiconductor chip 40 and one or more second lower connecting pad(s) 55 and one or more second connecting bump(s) 57 of the second semiconductor chip 50.

The inner mold layer MD may be interposed between the second semiconductor chip 50 and a third semiconductor chip 60. The inner mold layer MD may completely cover an exposed upper surface of the second semiconductor chip 50 and an exposed bottom surface of the third semiconductor chip 60. The inner mold layer MD may directly contact one or more second upper connecting pad(s) 56 of the second semiconductor chip 50 and one or more third lower connecting pad(s) 65 and one or more third connecting bump(s) 67 of the third semiconductor chip 60.

The inner mold layer MD may be interposed between the third semiconductor chip 60 and a fourth semiconductor chip 70. The inner mold layer MD may completely cover an exposed upper surface of the third semiconductor chip 60 and an exposed bottom surface of the fourth semiconductor chip 70. The inner mold layer MD may directly contact one or more third upper connecting pad(s) 66 of the third semiconductor chip 60, and one or more fourth lower connecting pad(s) 75 and one or more fourth connecting bump(s) 77 of the fourth semiconductor chip 70.

FIGS. 10 to 23 are sectional views explaining a method for manufacturing a semiconductor package in accordance with an exemplary embodiment of the disclosure. FIG. 19 is an enlarged view of a portion E of FIG. 18. FIG. 21 is an enlarged view of a portion F of FIG. 20.

Figure 10:
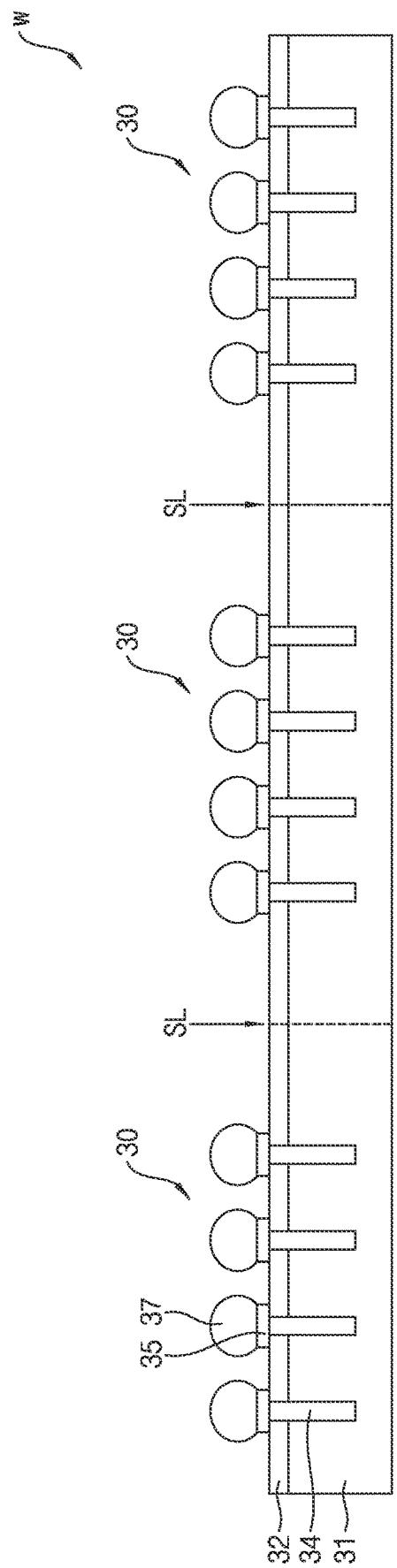
FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, and FIG. 23 are sectional views explaining a method for manufacturing a semiconductor package in accordance with an exemplary embodiment of the disclosure.

Referring to FIG. 10, the method may include providing a semiconductor wafer W. The semiconductor wafer W may include a plurality of base chips 30 divided from one another by scribe lanes SL. Each of the base chips 30 may include a base substrate 31, a base device layer 32, and one or more TSV(s) 34.

The base device layer 32 may be formed on one surface of the base substrate 31. The base device layer 32 may include a plurality of individual devices, and, for example, may include LSI, flash memory, DRAM, SRAM, EEPROM, PRAM, MRAM, or RRAM. The base device layer 32 may include a plurality of wiring structures for connecting the plurality of individual devices to a conductive region and/or wirings formed on the base substrate 31.

The TSV(s) 34 may extend from one surface of the base substrate 31 into the base substrate 31. The TSV(s) may have a pillar shape. The TSV(s) 34 may be electrically connected to the wiring structures in the base device layer 32. The TSV(s) 34 may include a conductive material.

The method may include forming one or more lower connecting pad(s) 35 and one or more connecting bump(s) 37 on the semiconductor wafer W. The lower connecting pad(s) 35 may be formed to be electrically connected to the TSV(s) 34 on the base device layer 32. For example, the lower connecting pad(s) 35 may be electrically connected to the TSV(s) 34 via the wiring structures in the base device layer 32. The lower connecting pad(s) 35 may be formed by depositing a metal layer on the base device layer 32, and then patterning the metal layer. The connecting bump(s) 37 may be formed on corresponding ones of the lower connecting pad(s) 35. For example, the connecting bump(s) 37 may be formed through a reflow process.

Figure 11:
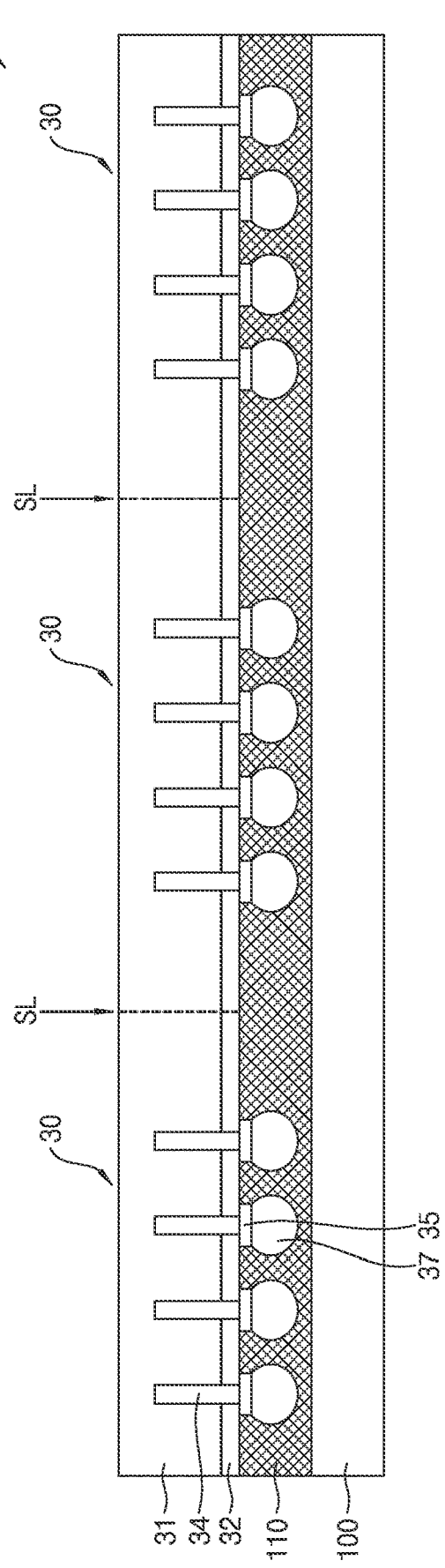

Referring to FIG. 11, the method may include attaching the semiconductor wafer W formed with the connecting bump(s) 37 to a carrier substrate 100. The semiconductor wafer W may be attached to the carrier substrate 100 via an adhesive material 110. The semiconductor wafer W may be disposed on the carrier substrate 100 such that each of the connecting bump(s) 37 is directed to the carrier substrate 100. The adhesive material 110 may cover the connecting bump(s) 37 between the carrier substrate 100 and the semiconductor wafer W.

Figure 12:
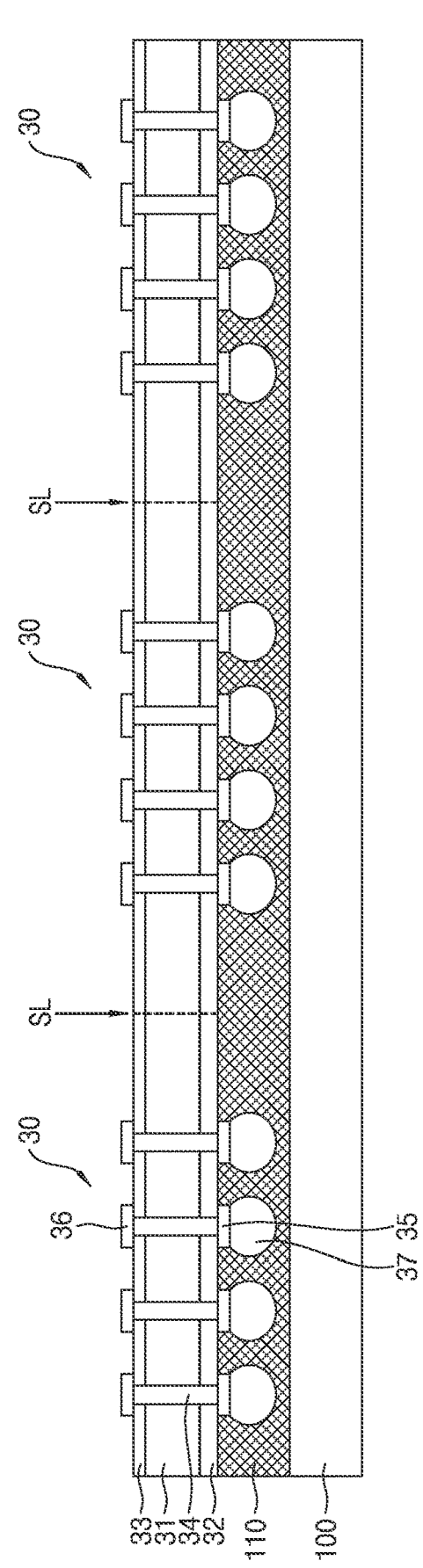

Referring to FIG. 12, the method may include forming a base protective layer 33 and one or more upper connecting pad(s) 36. Formation of the base protective layer 33 may include removing a portion of the base substrate 31, thereby exposing the TSV(s) 34. For example, exposure of the TSV(s) 34 may include a chemical mechanical polishing (CMP) process and an etch-back process. Thereafter, the base protective layer 33 may be formed to cover the TSV(s) 34. For example, the base protective layer 33 may be formed through a spin coating process or a spray process. For example, the base protective layer 33 may include an insulating polymer. Subsequently, a portion of the base protective layer 33 is removed, thereby exposing the TSV(s) 34. Thereafter, the upper connecting pad(s) 36 may be formed on the base protective layer 33 such that each of the upper connecting pad(s) 36 is electrically connected to the TSV(s) 34.

Figure 13:
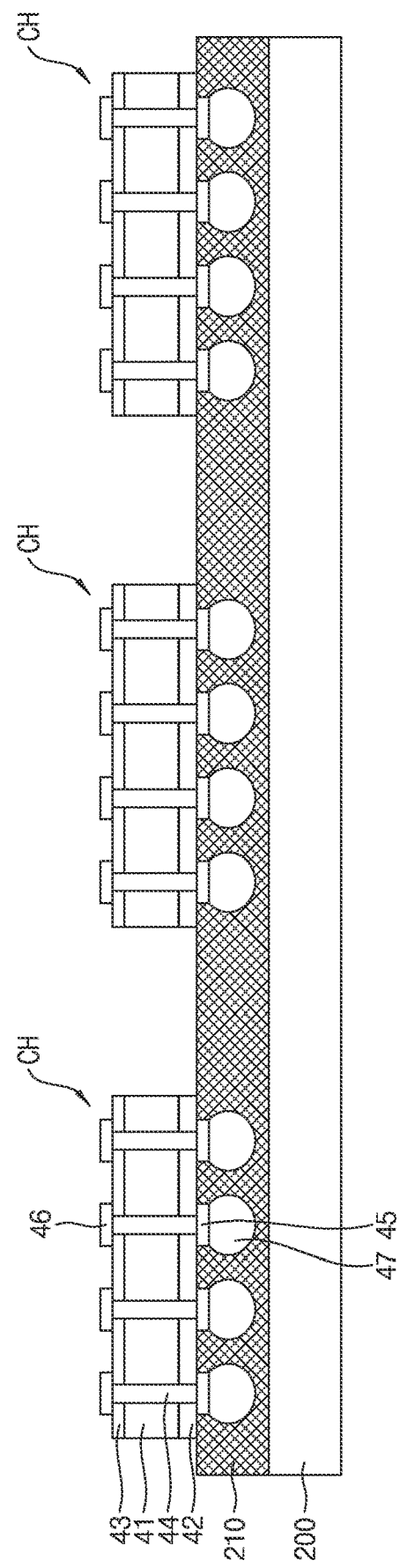

Referring to FIG. 13, the method may include forming a plurality of semiconductor chips CH. Formation of the plurality of semiconductor chips CH may include performing processes identical to the processes described with reference to FIGS. 10 to 12 for a semiconductor wafer separate from the semiconductor wafer W of FIG. 10, and dividing the semiconductor wafer into a plurality of semiconductor chips CH. Each of the plurality of semiconductor chips CH may include a first semiconductor substrate 41, a first protective layer 43, one or more first TSV(s) 44, one or more first lower connecting pad(s) 45, one or more of the first upper connecting pad(s) 46, and one or more first connecting bump(s) 47. The plurality of semiconductor chips CH may be disposed on a carrier substrate 200 via an adhesive material 210.

Figure 14:
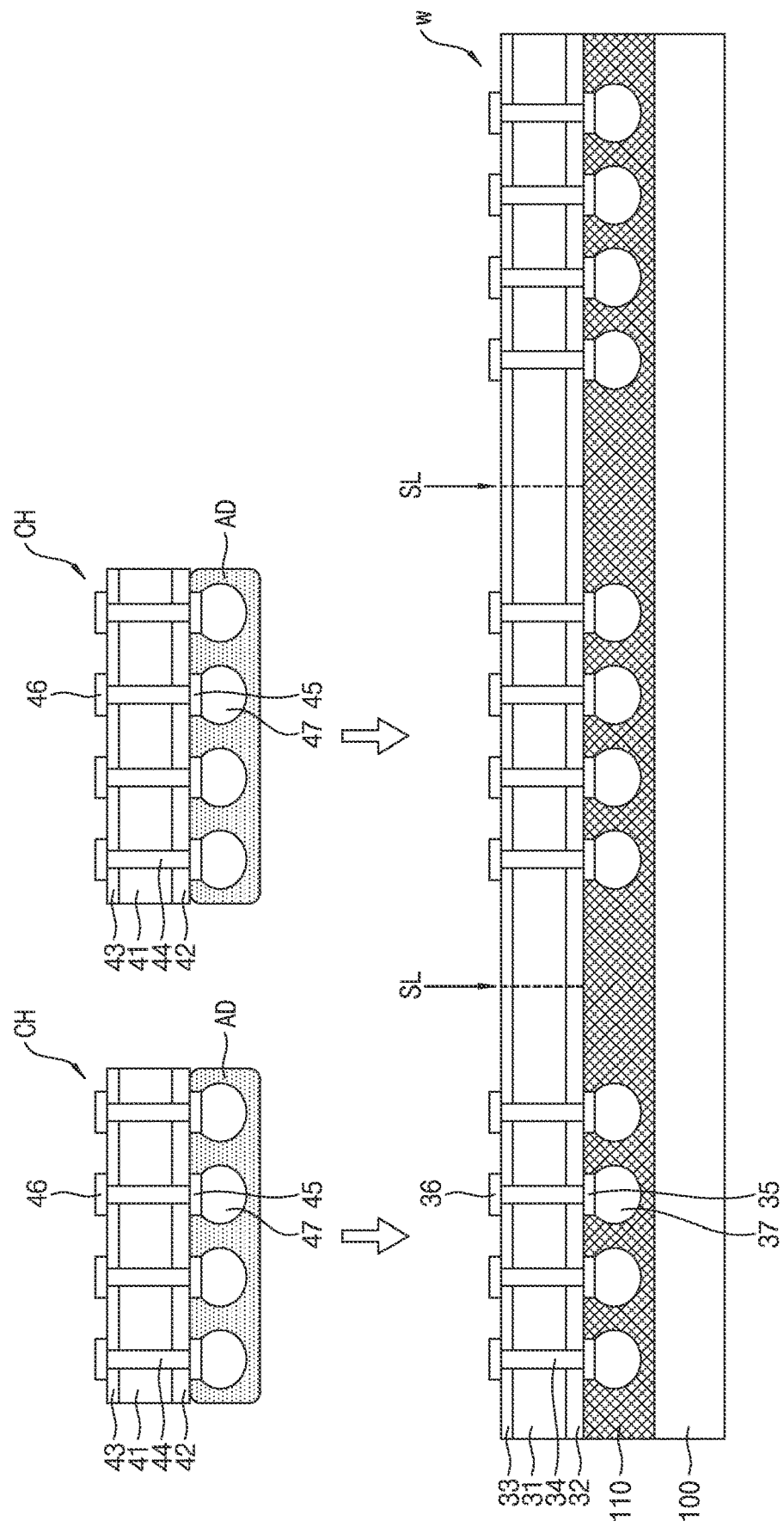
Figure 15:
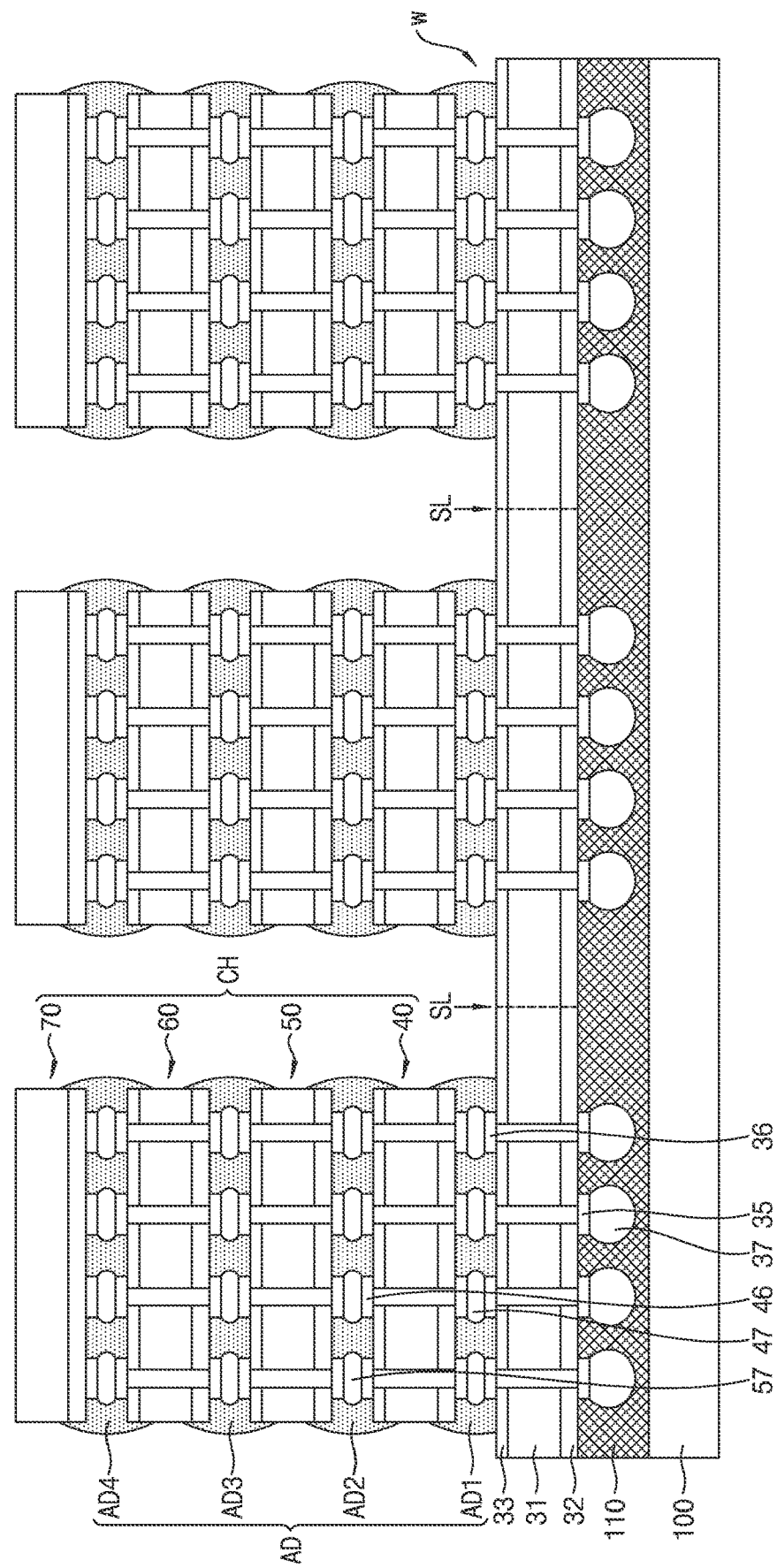

Referring to FIGS. 14 and 15, the method may include attaching the plurality of semiconductor chips CH to the semiconductor wafer W. The plurality of semiconductor chips CH may be mounted on the semiconductor wafer W and, as such, a chip-on-wafer (COW) structure may be formed. The plurality of semiconductor chips CH may be separated from the carrier substrate 200 shown in FIG. 13, and may then be vertically stacked on the semiconductor wafer W. Each of the plurality of semiconductor chips CH may be attached to the semiconductor wafer W or another semiconductor chip CH mounted on the semiconductor wafer W via an adhesive layer AD.

The adhesive layer AD may be provided at one surface of each of the plurality of semiconductor chips CH separated from the carrier substrate 200. The adhesive layer AD may be formed to cover one or more of the first lower connecting pad(s) 45 and the first connecting bump(s) 47 on one surface of each of the plurality of semiconductor chips CH. After formation of the adhesive layer AD on one surface of one semiconductor chip CH, the semiconductor chip CH may be mounted on the semiconductor wafer W under the condition that the adhesive layer AD and the first connecting bump(s) 47 of the semiconductor chip CH are directed to the semiconductor wafer W.

As a first semiconductor chip 40 is mounted on the semiconductor wafer W, the first connecting bump(s) 47 of the first semiconductor chip 40 may contact corresponding ones of the upper connecting pad(s) 36 of the semiconductor wafer W. A second semiconductor chip 50 may be mounted on the first semiconductor chip 40, and second connecting bump(s) 57 of the second semiconductor chip 50 may contact corresponding ones of the first upper connecting pad(s) 46 of the first semiconductor chip 40. A third semiconductor chip 60 may be mounted on the second semiconductor chip 50 and a fourth semiconductor chip 70 may be mounted on the third semiconductor chip 60 in a manner identical to the manner in which the second semiconductor chip 50 is mounted on the first semiconductor chip 40.

After stacking of the plurality of semiconductor chips CH on the semiconductor wafer W, a reflow process or a thermocompression process may be performed. For example, a first reflow process or a first thermocompression process may be performed after the first semiconductor chip 40 is stacked on the semiconductor wafer W, and a second reflow process or a second thermocompression process may be performed after the second semiconductor chip 50 is stacked on the first semiconductor chip 40. Alternatively, a reflow process or a thermocompression process may be performed after all of the plurality of semiconductor chips CH are stacked on the semiconductor wafer W.

Figure 16:
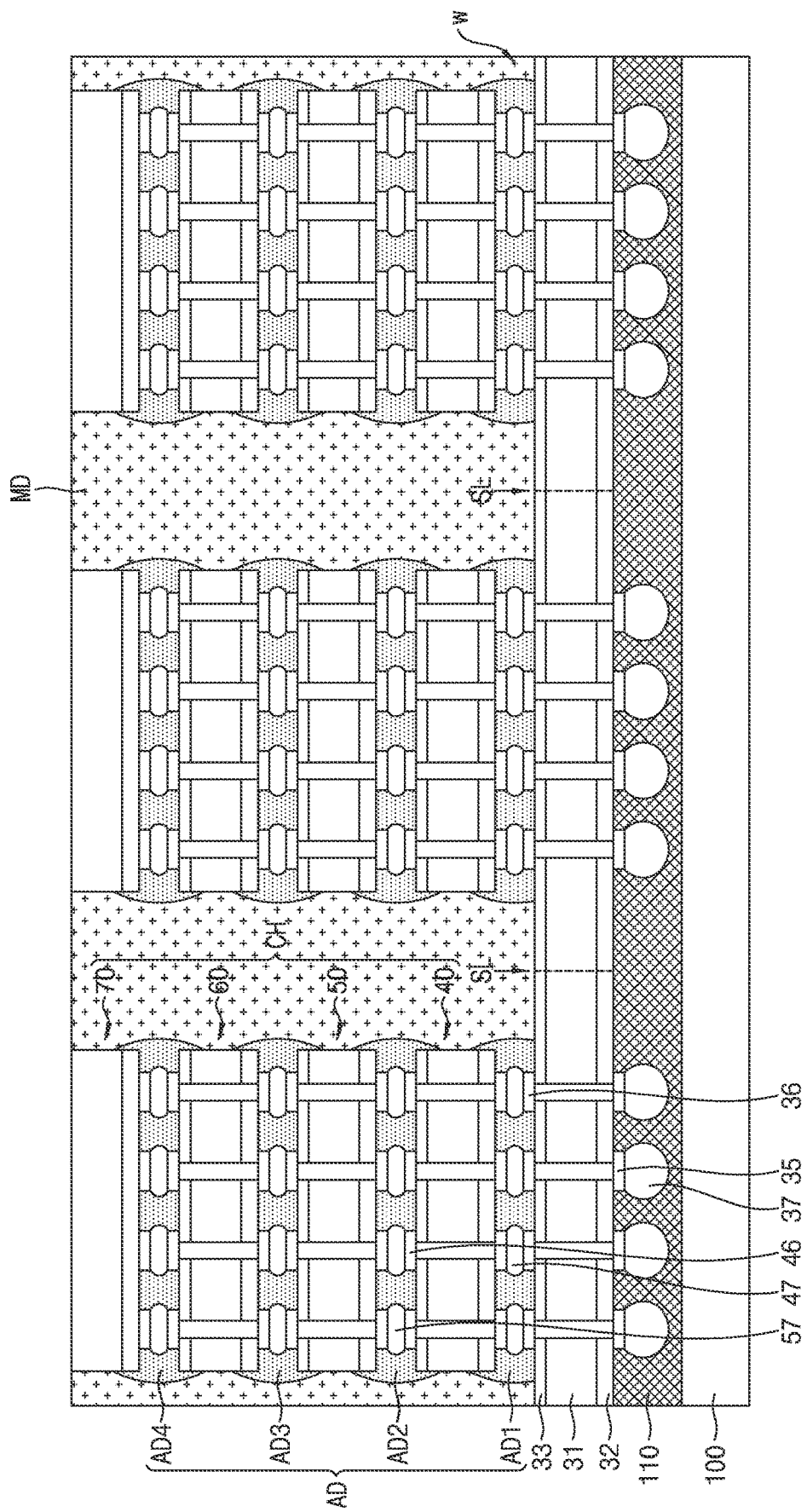

Referring to FIG. 16, the method may include forming an inner mold layer MD. The inner mold layer MD may be formed to cover the semiconductor wafer W, the plurality of semiconductor chips CH, and the plurality of adhesive layers AD. The inner mold layer MD may be formed to cover an upper surface of the fourth semiconductor chip 70, and an upper portion of the inner mold layer MD may then be removed through a grinding process such that the upper surface of the fourth semiconductor chip 70 is exposed.

Figure 17:
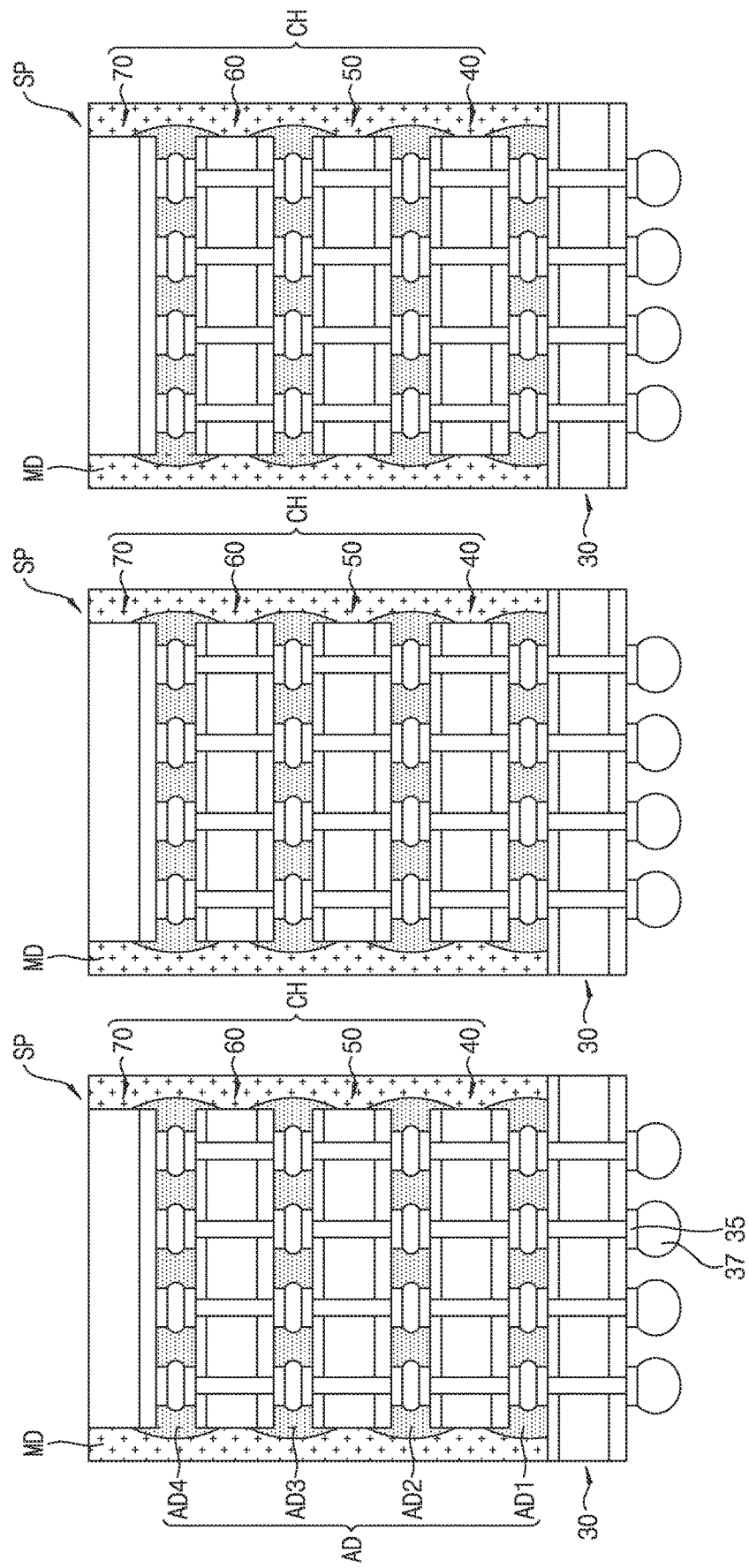

Referring to FIG. 17, the method may include dividing the semiconductor wafer W and the inner mold layer MD, thereby forming a plurality of sub-semiconductor packages SP. The semiconductor wafer W may be cut along scribe lanes SL through a dicing process and, as such, may be divided into a plurality of base chips 30. The inner mold layer MD may be cut along cut surfaces extending from the scribe lanes SL and, as such, may be divided into a plurality of inner mold layers MD. Each of the plurality of sub-semiconductor packages SP may include one base chip 30 separated from the semiconductor wafer W, and the plurality of semiconductor chips CH, the plurality of adhesive layers AD and the inner mold layer MD on the base chip 30. The plurality of sub-semiconductor packages SP may be separated from the carrier substrate 100 and the adhesive material 110. Accordingly, the bottom surface, the lower connecting pad(s) 35 and the connecting bump(s) 37 of the base chip 30 may be exposed outwards.

Figure 18:
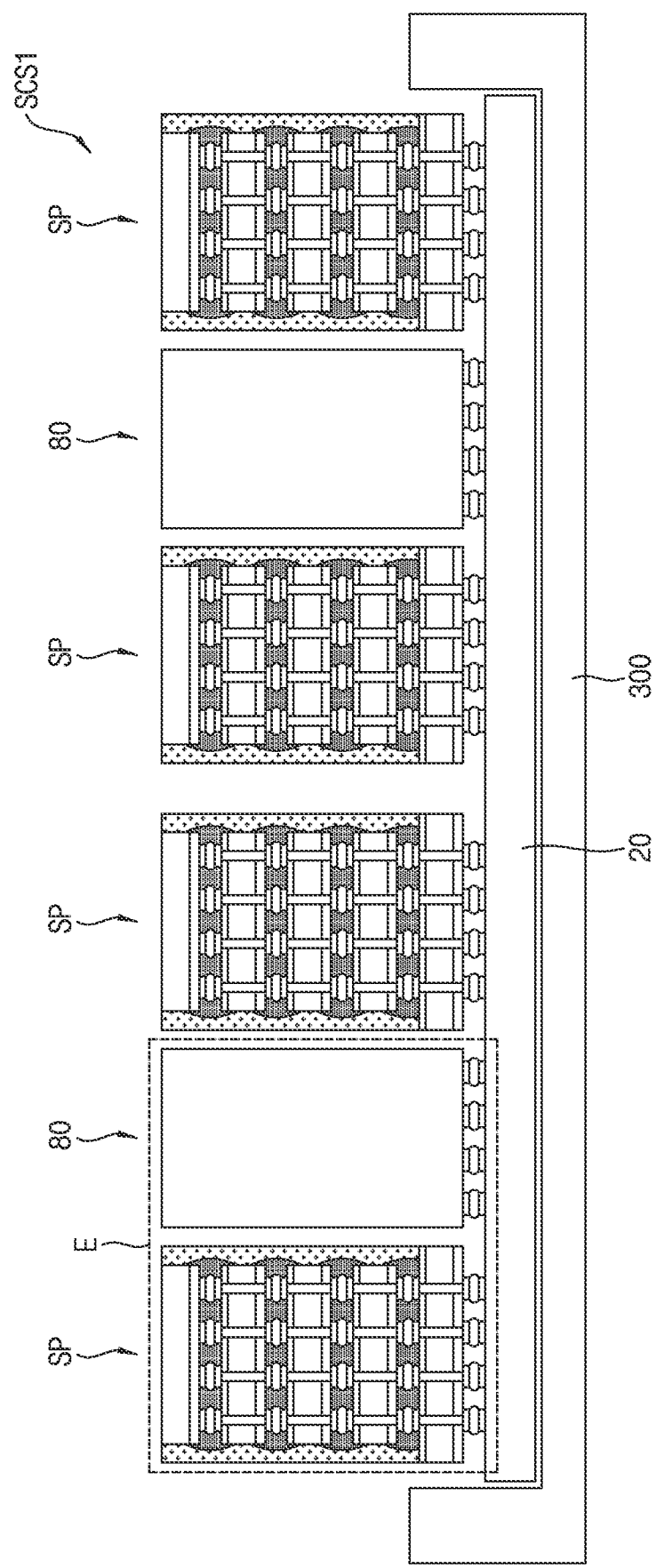
Figure 19:
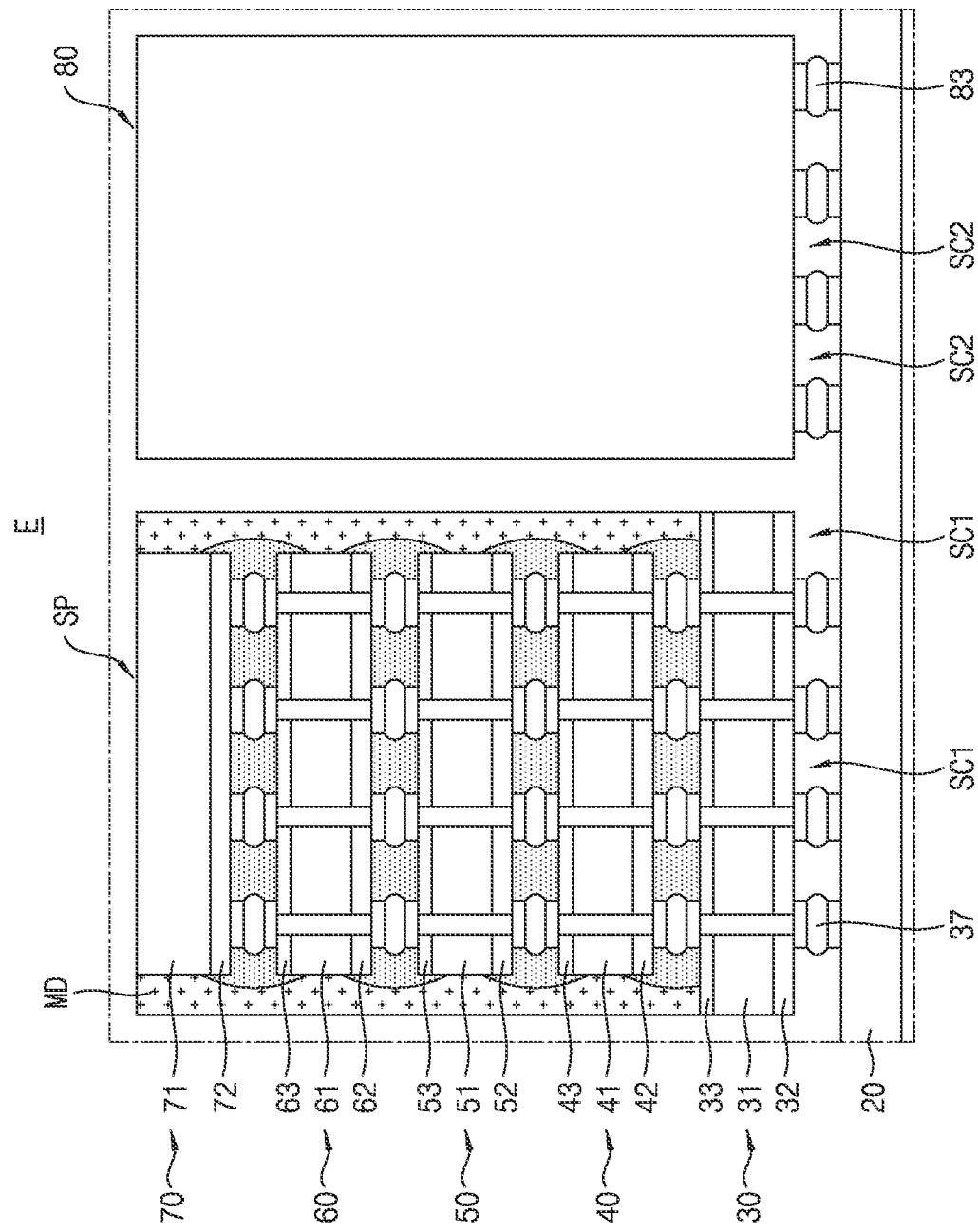

Referring to FIGS. 18 and 19, the method may include disposing the plurality of sub-semiconductor packages SP and the plurality of main semiconductor chips 80 on a package substrate 20, thereby forming a first semiconductor structure SCS1. The first semiconductor structure SCS1 may include the package substrate 20, the plurality of sub-semiconductor packages SP, and the plurality of main semiconductor chips 80. The plurality of sub-semiconductor packages SP and the plurality of main semiconductor chips 80 may be disposed to be spaced apart from one another by a predetermined distance.

Each sub-semiconductor package SP may be attached to the package substrate 20 via the connecting bump(s) 37 of the base chip 30 thereof. Each main semiconductor chip 80 may be attached to the package substrate 20 via the connecting bump(s) 83 thereof. The sub-semiconductor package SP may be disposed on the package substrate 20, and a reflow process and/or a thermocompression process may be performed for the connecting bump(s) 37. The main semiconductor chip 80 may be disposed on the package substrate 20, and a reflow process and/or a thermocompression process may be performed for the connecting bump(s) 83.

As the sub-semiconductor package SP is disposed on the package substrate 20, a first space SC1 may be formed between the package substrate 20 and the sub semiconductor package SP. As the main semiconductor chip 80 is disposed on the package substrate 20, a second space SC2 may be formed between the package substrate 20 and the main semiconductor chip 80. Accordingly, a method for manufacturing a semiconductor package may include forming first spaces between respective sub-semiconductor packages and the package substrate 20, and forming second spaces between respective main semiconductor chips and the package substrate 20.

The method may include disposing the first semiconductor structure SCS1 on a first mold 300. For example, the package substrate 20 may be fixed to the first mold 300.

Figure 20:
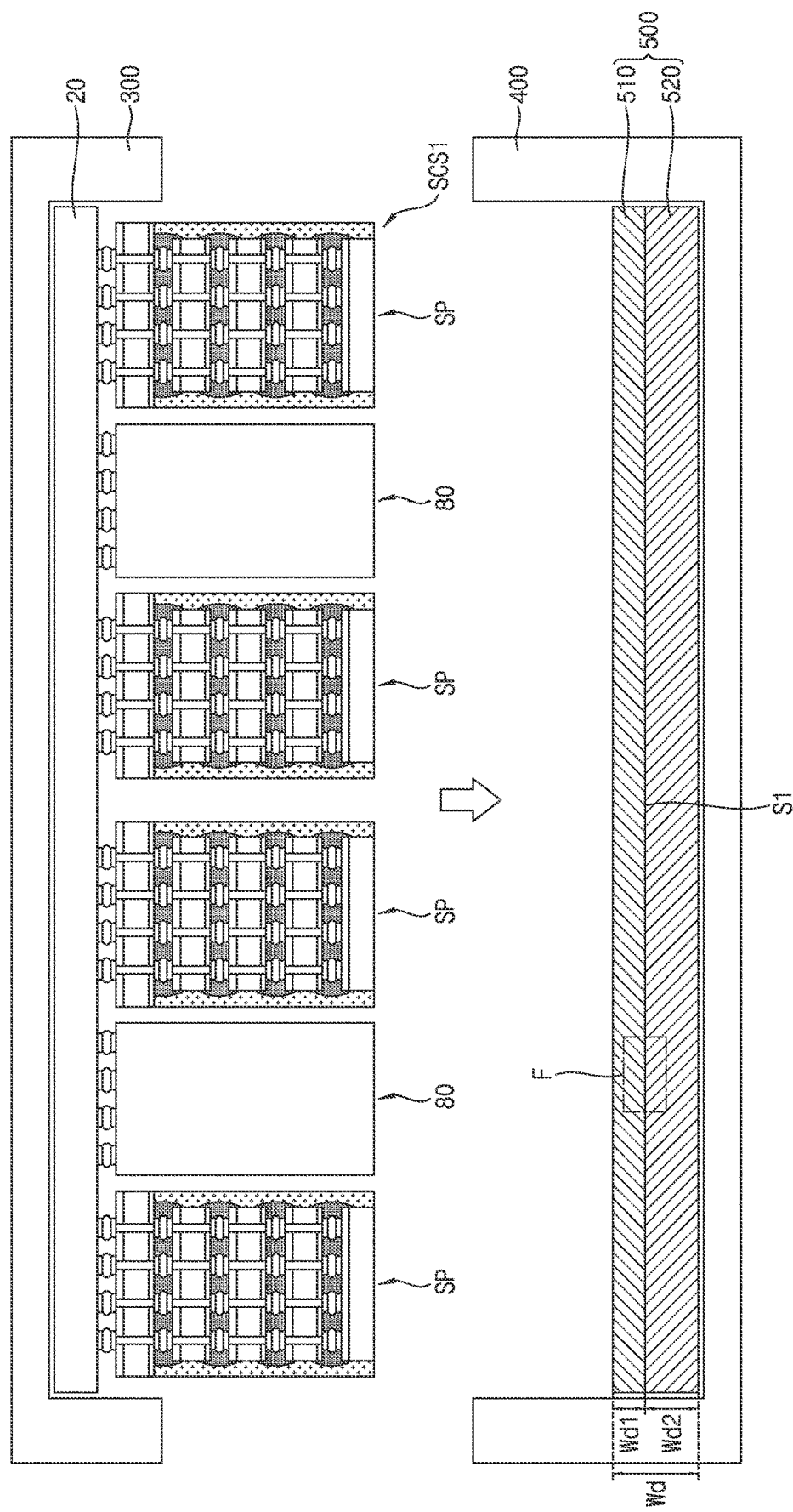
Figure 21:
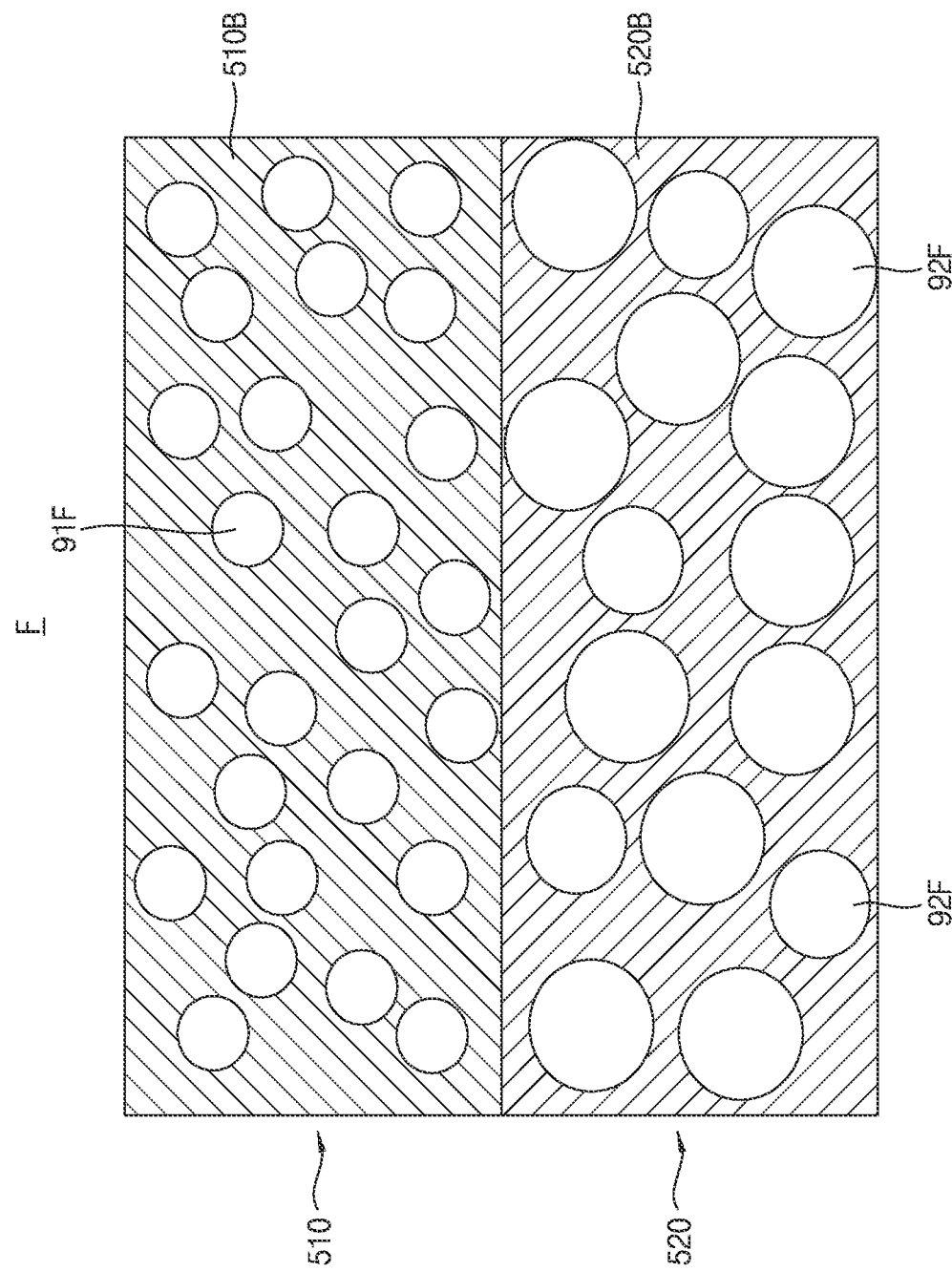

Referring to FIG. 20, the method may include disposing a mold film 500 in a second mold 400. The second mold 400 may be coupled to the first mold 300 and, as such, may be formed with a cavity therein. The mold film 500 may include a first mold film 510 and a second mold film 520. The second mold film 520 may be directly disposed on the second mold 400, and the first mold film 510 may be directly disposed on the second mold film 520. One surface Si of the first mold film 510 contacting the second mold film 520 may be spaced apart from the second mold 400. A surface of the first mold film 510 opposite to the surface Si may also be spaced apart from the second mold 400.

In an embodiment, a thickness Wd of the mold film 500 may be about 40 to 60% of the height of the sub-semiconductor package SP. The height of the sub-semiconductor package SP may mean a vertical distance from an upper surface of the package substrate 20 to an upper surface of the sub-semiconductor package SP. For example, the thickness Wd of the mold film 500 may be about 250 to 350 μm. In an embodiment, a thickness Wd1 of the first mold film 510 and a thickness Wd2 of the second mold film 520 may be different. For example, the thickness Wd1 of the first mold film 510 may be smaller than the thickness Wd2 of the second mold film 520.

Referring to FIG. 21, the first mold film 510 may include a first base film 510B, and first fillers 91F distributed in the first base film 510B. The second mold film 520 may include a second base film 520B, and second fillers 92F distributed in the second base film 520B. The first base film 510B may include at least one polymer material. The first fillers 91F may include a material such as silica or alumina. The second base film 520B may include at least one polymer material. The second fillers 92F may include a material such as silica or alumina. The first base film 510B may be made of the same material as the first base material 91B described with reference to FIG. 3. The second base film 520B may be made of the same material as the second base material 92B described with reference to FIG. 3. For example, the viscosity of the first base film 510B may be lower than the viscosity of the second base film 520B.

Figure 22:
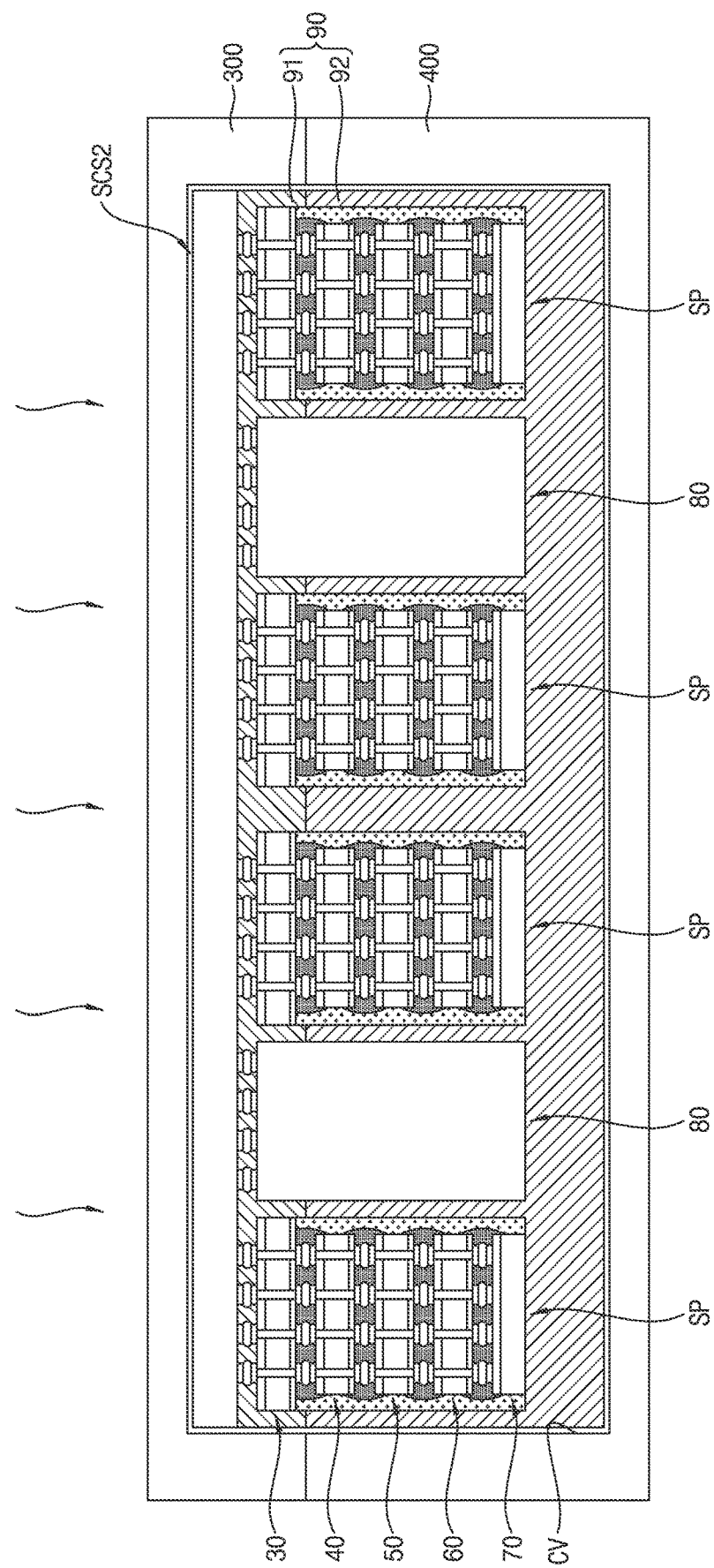

Referring to FIGS. 20 and 22, the method may include coupling the first mold 300 and the second mold 400 to each other, thereby forming a cavity CV. The first mold 300 and the second mold 400 may be coupled to each other under the condition that the first mold 300, at which the first semiconductor structure SCS1 is disposed, is inverted such that the sub-semiconductor packages SP and the main semiconductor chips 80 are directed to the mold film 500 in the second mold 400. As the first mold 300 and the second mold 400 are coupled to each other, the cavity CV may be formed and, as such, the sub-semiconductor packages SP and the main semiconductor chips 80 may be disposed in the cavity CV.

The method may include pressing the mold film 500 against the first semiconductor structure SCS1, and heat treating the mold film 500, thereby forming an outer mold layer 90. As the mold film 500 is deformed into the outer mold layer 90 covering the first semiconductor structure SCS1, a second semiconductor structure SCS2 including the first semiconductor structure SCS1 and the outer mold layer 90 may be formed.

The sub-semiconductor package SP and/or the main semiconductor chip 80 of the first semiconductor structure SCS1 may press the mold film 500 at about 1 to 20 MPa. For example, as the first mold 300 and the second mold 400 are coupled to each other, the sub-semiconductor package SP and/or the main semiconductor chip 80 may press the mold film 500. During or after coupling of the first mold 300 and the second mold 400, heat treatment may be performed for the mold film 500. Heat treatment for the mold film 500 may be performed simultaneously with pressing of the mold film 500 against the first semiconductor structure SCS1. The mold film 500 may be heated to about 100 to 200° C.

As pressing and heat treatment for the mold film 500 are performed, the mold film 500 may be melted and, as such, may cover the sub-semiconductor package SP and the main semiconductor chip 80. As the first mold film 510 is melted, the first mold film 510 may cover lower portions of the sub semiconductor package SP and the main semiconductor chip 80 (when viewed with reference to FIG. 18) (upper portions when viewed in FIG. 22), and may cover the upper surface of the package substrate 20. As the second mold film 520 is melted, the second mold film 520 may cover upper portions of the sub semiconductor package SP and the main semiconductor chip 80 (when viewed with reference to FIG. 18) (lower portions when viewed in FIG. 22). For example, the first base film 510B of the first mold film 510 may be melted and, as such, may form a first base material 91B covering portions of the sub-semiconductor packages SP and the main semiconductor chips 80, and the second base film 520B of the second mold film 520 may be melted and, as such, may form a second base material 92B covering other portions of the sub-semiconductor packages SP and the main semiconductor chips 80. The first fillers 91F may be distributed in the first base material 91B, and the second fillers 92F may be distributed in the second base material 92B.

Thereafter, the melted first mold film 510 (or the first base film 510B) may be cured and, as such, a first outer mold layer 91 may be formed, and the melted second mold film 520 (or the second base film 520B) may be cured and, as such, a second outer mold layer 92 may be formed.

The first outer mold layer 91 may be formed to cover the lower portions of the sub-semiconductor package SP and the main semiconductor chip 80 (when viewed with reference to FIG. 18) (the upper portions when viewed in FIG. 22). The first outer mold layer 91 may be formed to fill the first space SC1 and the second space SC2 (cf. FIG. 19). The first outer mold layer 91 may be formed to cover the upper surface of the package substrate 20. The first outer mold layer 91 may be formed to cover at least a portion of the base chip 30. In an embodiment, the first outer mold layer 91 may be formed to contact a portion of the inner mold layer MD of the sub-semiconductor package SP. The second outer mold layer 92 may be formed to cover the upper portions of the sub semiconductor package SP and the main semiconductor chip 80 (when viewed with reference to FIG. 18) (the lower portions when viewed in FIG. 22). The second outer mold layer 92 may cover portions not covered by the first outer mold layer 91 from among overall portions of the sub-semiconductor package SP and the main semiconductor chip 80 on the first outer mold layer 91. The second outer mold layer 92 may be formed to be spaced apart from the package substrate 20. In an embodiment, the second outer mold layer 92 may be formed to be spaced apart from the base chip 30.

Figure 23:
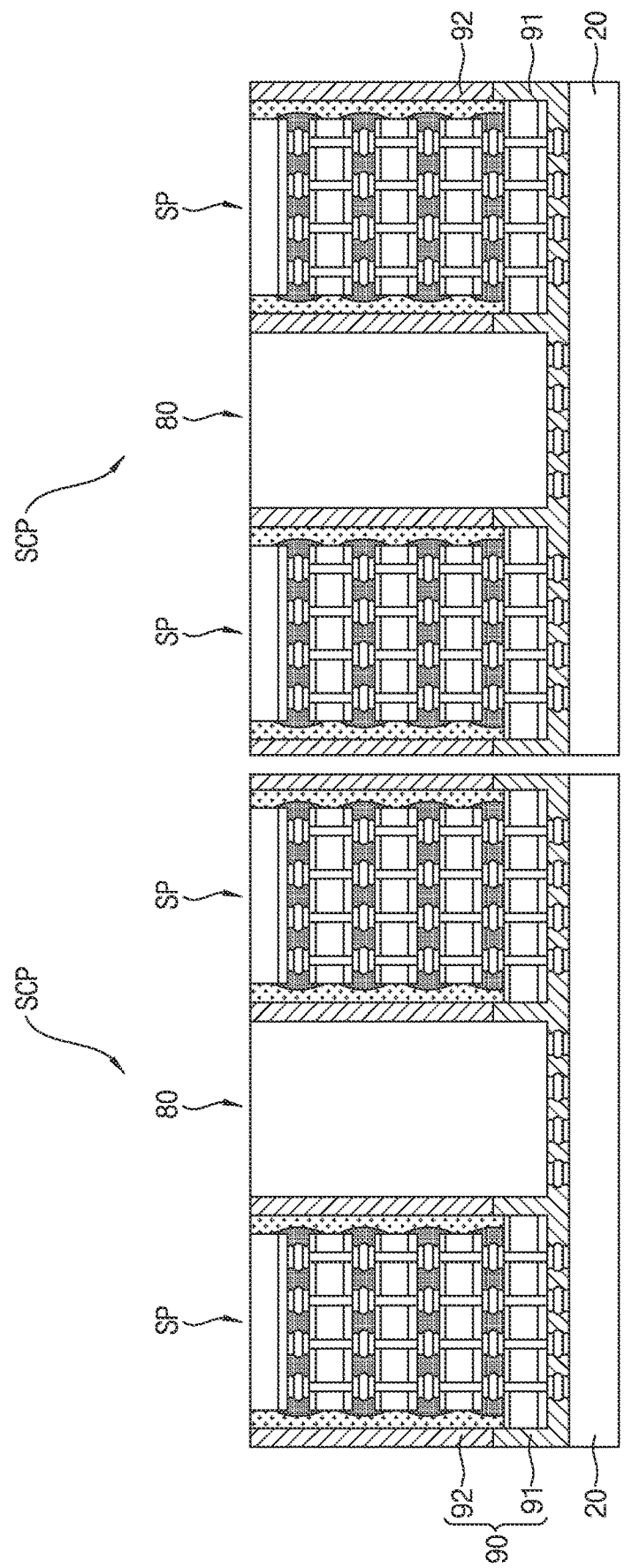

Referring to FIG. 23, the method may include removing a portion of the outer mold layer 90 of the second semiconductor structure SCS2 through a grinding process, thereby exposing an upper surface of the sub-semiconductor package SP and/or an upper surface of the main semiconductor chip 80. The second semiconductor structure SCS2 may be separated from the first mold 300 and the second mold 400, and a grinding process may then be formed to remove a portion of the second outer mold layer 92.

The method may include dicing the second semiconductor structure SCS2, thereby forming a plurality of semiconductor packages SCP. The plurality of semiconductor packages SCP each including one sub-semiconductor package SP and one main semiconductor chip 80 may be formed by dicing the package substrate 20 and the outer mold layer 90 of the second semiconductor structure SCS2. Thereafter, the plurality of semiconductor packages SCP may be mounted on a first package substrate 10 (cf. FIG. 4).

In accordance with the exemplary embodiments of the disclosure, a 2-layer mold including a first mold layer and a second mold layer respectively having different physical properties may be used. As such, it may be possible to prevent occurrence of a warpage phenomenon and a crack generation phenomenon while enhancing gap-fill characteristics in a semiconductor package.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package, comprising:
    a package substrate;
    a base chip disposed on the package substrate;
    a first semiconductor chip disposed on the base chip;
    a second semiconductor chip disposed on the first semiconductor chip;
    an inner mold layer surrounding an upper surface of the base chip and respective side surfaces of the first semiconductor chip and the second semiconductor chip;
    a first outer mold layer interposed between the package substrate and the base chip while covering at least a portion of a side surface of the base chip; and
    a second outer mold layer disposed on the first outer mold layer while covering at least a portion of a side surface of the inner mold layer, the second outer mold layer being spaced apart from the package substrate,
    wherein the first outer mold layer and the second outer mold layer have different viscosities, respectively,
    wherein an under surface of the first outer mold layer is in contact with the package substrate,
    wherein an upper surface of the first outer mold layer is in contact with an under surface of the second outer mold layer,
    wherein an outer surface of the first outer mold layer extends from the upper surface of the first outer mold layer to the under surface of the first outer mold layer,
    wherein the upper surface of the first outer mold layer and the under surface of the second outer mold layer are flat, and
    wherein the upper surface of the first outer mold layer is in contact with the under surface of the second outer mold layer.

2. The semiconductor package according to claim 1, wherein a level of the upper surface of the first outer mold layer is higher than a level of the upper surface of the base chip while being lower than a level of a bottom surface of the first semiconductor chip.

3. The semiconductor package according to claim 1, wherein the first outer mold layer contacts the inner mold layer.

4. The semiconductor package according to claim 1, wherein a level of the upper surface of the first outer mold layer is higher than a level of a bottom surface of the first semiconductor chip, and a thickness of the first outer mold layer is smaller than a thickness of the second outer mold layer.

5. The semiconductor package according to claim 1, wherein a Young's modulus of the first outer mold layer is smaller than a Young's modulus of the second outer mold layer.

6. The semiconductor package according to claim 1, wherein:
    the first outer mold layer comprises a first base material and a first filler;
    the second outer mold layer comprises a second base material and a second filler; and
    an average size of the first filler is smaller than an average size of the second filler.

7. The semiconductor package according to claim 6, wherein a viscosity of the first base material is lower than a viscosity of the second base material.

8. The semiconductor package according to claim 1, further comprising:
    a first adhesive layer interposed between the base chip and the first semiconductor chip; and
    a second adhesive layer interposed between the first semiconductor chip and the second semiconductor chip,
    wherein the inner mold layer covers a side surface of the first adhesive layer and a side surface of the second adhesive layer.

9. The semiconductor package according to claim 1, wherein:
    the first semiconductor chip comprises a first lower connecting pad and a first connecting bump disposed on a bottom surface of the first semiconductor chip, and a first upper connecting pad disposed on an upper surface of the first semiconductor chip;
    the second semiconductor chip comprises a second lower connecting pad and a second connecting bump disposed on a bottom surface of the second semiconductor chip; and
    the inner mold layer is interposed between the first base chip and the first semiconductor chip while contacting the first lower connecting pad and the first connecting bump, and is interposed between the first semiconductor chip and the second semiconductor chip while contacting the first upper connecting pad, the second lower connecting pad and the second connecting bump.

10. The semiconductor package according to claim 1, wherein a thickness of the first outer mold layer is about 5 to 100 μm.

11. The semiconductor package according to claim 1, wherein the second outer mold layer is spaced apart from the base chip.

12. The semiconductor package according to claim 1, wherein:
    the base chip comprises a lower connecting pad and a connecting bump disposed between the package substrate and the base chip and electrically connected to the package substrate; and
    the first outer mold layer covers the lower connecting pad and the connecting bump.

13. The semiconductor package according to claim 1, wherein:
    the base chip comprises a base substrate, a base device layer on a bottom surface of the base substrate, and a base protective layer on the upper surface of the base substrate; and
    the first outer mold layer covers the base substrate, the base device layer and the base protective layer.

14. A semiconductor package, comprising:
    a package substrate;
    a sub-semiconductor package disposed on the package substrate, the sub-semiconductor package comprising a base chip disposed on the package substrate, a first semiconductor chip disposed on the base chip, a second semiconductor chip disposed on the first semiconductor chip, and an inner mold layer covering an upper surface of the base chip while covering respective side surfaces of the first semiconductor chip and the second semiconductor chip;

a main semiconductor chip disposed on the package substrate while being spaced apart from the sub-semiconductor package; and an outer mold layer covering the sub-semiconductor package and the main semiconductor chip, wherein the outer mold layer comprises a first outer mold layer interposed between the package substrate and the base chip and between the package substrate and the main semiconductor chip, and a second outer mold layer covering an upper surface of the first outer mold layer while being spaced apart from the package substrate, wherein the first outer mold layer and the second outer mold layer have different viscosities, respectively, wherein an under surface of the first outer mold layer is in contact with the package substrate, wherein an upper surface of the first outer mold layer is in contact with an under surface of the second outer mold layer, wherein the upper surface of the first outer mold layer and an outer side surface of the first outer mold layer intersect, and wherein the under surface of the second outer mold layer and an outer side surface of the second outer mold layer intersect.

15. The semiconductor package according to claim 14, wherein:
the first outer mold layer comprises a first base material and a first filler; and
the second outer mold layer comprises a second base material and a second filler.

16. The semiconductor package according to claim 15, wherein an average size of the first filler is smaller than an average size of the second filler.

17. The semiconductor package according to claim 15, wherein a viscosity of the first base material is lower than a viscosity of the second base material.

18. The semiconductor package according to claim 14, wherein the second outer mold layer is spaced apart from the base chip.

19. The semiconductor package according to claim 14, wherein a thickness of the first outer mold layer is smaller than a thickness of the second outer mold layer.

20. A semiconductor package, comprising:
a first package substrate;
a second package substrate disposed on the first package substrate;
a connecting bump and an underfill disposed between the first package substrate and the second package substrate;
a base chip disposed on the second package substrate, the base chip comprising a base substrate, a through-silicon via (TSV) extending through the base substrate, and a connecting bump electrically connected to the TSV, the connecting bump being electrically connected to the second package substrate;
a first semiconductor chip disposed on the base chip, the first semiconductor chip comprising a first semiconductor substrate, a first TSV extending through the first semiconductor substrate, and a first connecting bump electrically connected to the first TSV, the first connecting bump being electrically connected to the base chip;
a plurality of second semiconductor chips disposed on the first semiconductor chip;
an inner mold layer surrounding a side surface of the base chip, a side surface of the first semiconductor chip and a side surface of the plurality of second semiconductor chips;
a main semiconductor chip disposed on the second package substrate while being spaced apart from the base chip, the first semiconductor chip and the plurality of second semiconductor chips;
a first outer mold layer interposed between the second package substrate and the base chip and between the second package substrate and the main semiconductor chip while surrounding the side surface of the base chip, the first outer mold layer comprising a first base material and a first filler; and
a second outer mold layer covering the first outer mold layer and the inner mold layer while being spaced apart from the base chip, the second outer mold layer comprising a second base material and a second filler,
wherein a viscosity of the first base material is lower than a viscosity of the second base material,
wherein a size of the first filler is smaller than a size of the second filler,
wherein an under surface of the first outer mold layer is in contact with the package substrate,
wherein an upper surface of the first outer mold layer is in contact with an under surface of the second outer mold layer,
wherein an outer side surface of the first outer mold layer and an outer side surface of the second outer mold layer are coplanar, and
wherein the outer side surface of the first outer mold layer and an outer side surface of the package substrate are coplanar.

* * * * *